(12) United States Patent
Basavalingappa et al.

(10) Patent No.: US 11,955,494 B2
(45) Date of Patent: Apr. 9, 2024

(54) POWER SUPPLY CONTACT SHARING FOR IMAGING DEVICES

(71) Applicant: SONY SEMICONDUCTOR SOLUTIONS CORPORATION, Kanagawa (JP)

(72) Inventors: Adarsh Basavalingappa, Fairport, NY (US); Taisuke Suwa, Auderghem (BE); Michiel Timmermans, Werchter (BE); Frederick Brady, Webster, NY (US); Jeongsoo Han, Pittsford, NY (US)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 203 days.

(21) Appl. No.: 17/610,268

(22) PCT Filed: May 21, 2020

(86) PCT No.: PCT/IB2020/000394
§ 371 (c)(1),
(2) Date: Nov. 10, 2021

(87) PCT Pub. No.: WO2020/234646
PCT Pub. Date: Nov. 26, 2020

(65) Prior Publication Data
US 2022/0254821 A1    Aug. 11, 2022

Related U.S. Application Data

(60) Provisional application No. 62/850,926, filed on May 21, 2019.

(51) Int. Cl.
*H01L 27/146* (2006.01)
*G01S 7/4914* (2020.01)

(52) U.S. Cl.
CPC ...... *H01L 27/14612* (2013.01); *G01S 7/4914* (2013.01)

(58) Field of Classification Search
None
See application file for complete search history.

(56) References Cited

U.S. PATENT DOCUMENTS

| | | | |
|---|---|---|---|
| 2010/0097508 | A1 | 4/2010 | Yanagita et al. |
| 2013/0182159 | A1 | 7/2013 | Wada et al. |
| | | (Continued) | |

FOREIGN PATENT DOCUMENTS

| | | |
|---|---|---|
| EP | 2180514 | 4/2010 |

OTHER PUBLICATIONS

International Search Report prepared by the European Patent Office dated Jul. 29, 2020, for International Application No. PCT/IB2020/000394, 4 pgs.

(Continued)

*Primary Examiner* — Mark T Monk
(74) *Attorney, Agent, or Firm* — SHERIDAN ROSS P.C.

(57) ABSTRACT

An imaging device includes a first pixel including a first photoelectric conversion region and a first amplification transistor, a second pixel adjacent the first pixel and including a second photoelectric conversion region and a second amplification transistor, and a first contact coupled to the first amplification transistor and the second amplification transistor, and that receives a power supply signal for the first amplification transistor and the second amplification transistor.

18 Claims, 23 Drawing Sheets

(56) References Cited

U.S. PATENT DOCUMENTS

| | | |
|---|---|---|
| 2014/0042302 A1 | 2/2014 | Yanagita et al. |
| 2014/0198183 A1* | 7/2014 | Kim ...................... H04N 25/65 |
| | | 250/214 R |
| 2016/0088254 A1 | 3/2016 | Yanagita et al. |
| 2016/0344920 A1 | 11/2016 | Iwahara |
| 2017/0077166 A1* | 3/2017 | Kitamori ........... H01L 27/14641 |
| 2018/0007306 A1 | 1/2018 | Yanagita et al. |

OTHER PUBLICATIONS

Written Opinion prepared by the European Patent Office dated Jul. 29, 2020, for International Application No. PCT/IB2020/000394, 7 pgs.

* cited by examiner

POWER SUPPLY CONTACT SHARING FOR IMAGING DEVICES

CROSS REFERENCE TO RELATED APPLICATIONS

This application is a national stage application under 35 U.S.C. 371 and claims the benefit of PCT Application No. PCT/IB2020/000394 having an international filing date of 21 May 2020, which designated the United States, which PCT application claimed the benefit of U.S. Provisional Application No. 62/850,926 filed 21 May 2019, the entire disclosures of each of which are incorporated herein by reference.

FIELD

Example embodiments are directed to imaging devices, imaging apparatuses, and methods for operating the same, and more particularly, to imaging devices, imaging apparatuses, and methods for depth sensing.

BACKGROUND

Depth sensing has applications in many fields, including object tracking, environment rendering, etc. Some depth sensors employ time-of-flight (ToF) principles to detect a distance to an object or objects within a scene. In general, a ToF depth sensor includes a light source and an imaging device including a plurality of pixels for sensing reflected light. In operation, the light source emits light (e.g., infrared light) toward an object or objects in the scene, and the pixels detect the light reflected from the object or objects. The elapsed time between the initial emission of the light and receipt of the reflected light by each pixel may correspond to a distance from the object or objects. Direct ToF imaging devices may measure the elapsed time itself to calculate the distance while indirect ToF imaging devices may measure the phase delay between the emitted light and the reflected light and translate the phase delay into a distance. The depth values of the pixels are then used by the imaging device to determine a distance to the object or objects, which may be used to create a three dimensional scene of the captured object or objects.

SUMMARY

Example embodiments relate to imaging devices, imaging apparatuses, and methods thereof that allow for fast charge transfer from photodiodes to pixel circuits, fast overflow reset, reduced pixel footprints, etc.

At least one example embodiment is directed to an imaging device including a first pixel including a first photoelectric conversion region and a first amplification transistor, a second pixel adjacent the first pixel and including a second photoelectric conversion region and a second amplification transistor, and a first contact coupled to the first amplification transistor and the second amplification transistor, and that receives a power supply signal for the first amplification transistor and the second amplification transistor.

According to at least one example embodiment, the first pixel and the second pixel are adjacent to one another in a row direction.

According to at least one example embodiment, the imaging device includes a third pixel adjacent to the second pixel in the row direction and including a third amplification transistor, a second contact coupled to the third amplification transistor, and a first wiring that electrically connects the first contact to the second contact to provide the power supply signal to the third amplification transistor.

According to at least one example embodiment, the first pixel includes a first transfer transistor and a second transfer transistor that transfer charge from the first photoelectric conversion region, and the second pixel includes a third transfer transistor and a fourth transfer transistor that transfer charge from the second photoelectric conversion region.

According to at least one example embodiment, the first transfer transistor receives a first transfer signal, the second transfer transistor receives a second transfer signal, the third transfer transistor receives a third transfer signal, and the fourth transfer transistor receives a fourth transfer signal. A distance to an object is calculated based on charge transferred using the first, second, third, and fourth transfer signals.

According to at least one example embodiment, the first transfer signal and the third transfer signal have a same phase difference with respect to a reference signal, and the second transfer signal and the fourth transfer signal have a same phase difference with respect to the optical signal.

According to at least one example embodiment, the first transfer signal and the third transfer signal have different phase differences with respect to a reference signal, and the second transfer signal and the fourth transfer signal have different phase differences with respect to the reference signal.

According to at least one example embodiment, the first amplification transistor and the second amplification transistor are between the first photoelectric conversion region and the second photoelectric conversion region in the row direction.

According to at least one example embodiment, gates of the first amplification transistor and the second amplification transistor are arranged in a column direction.

According to at least one example embodiment, the imaging device includes a second contact that receives the power supply signal, a third pixel adjacent to the first pixel in the column direction and including a third amplification transistor coupled to the second contact, and a third photoelectric conversion region, and a fourth pixel adjacent to the second pixel in the column direction and including a fourth amplification transistor coupled to the second contact, and a fourth photoelectric conversion region, wherein the fourth pixel is adjacent to the third pixel in the row direction.

According to at least one example embodiment, the imaging device includes third, fourth, fifth, and sixth contacts. The first pixel includes a first reset transistor and a second reset transistor, the second pixel includes a third reset transistor and a fourth reset transistor, the third pixel includes a fifth reset transistor and a sixth reset transistor, and the fourth pixel includes a seventh reset transistor and an eight reset transistor. The first reset transistor and the fifth reset transistor are coupled to the third contact, the second reset transistor and the sixth reset transistor are coupled to the fourth contact, third reset transistor and the seventh reset transistor are coupled to the fifth contact, and the fourth reset transistor and the eighth reset transistor are coupled to the sixth contact.

According to at least one example embodiment, the imaging device includes a first wiring electrically connected to the third, fourth, fifth, and sixth contacts and that receives a reset power signal for the first, second, third, fourth, fifth, sixth, seventh, and eighth reset transistors.

According to at least one example embodiment, the third pixel includes a fifth transfer transistor and a sixth transfer transistor that transfer charge from the third photoelectric conversion region. The fourth pixel includes a seventh transfer transistor and an eighth transfer transistor that transfer charge from the fourth photoelectric conversion region.

According to at least one example embodiment, the imaging device includes a first wiring electrically connected to the third, fourth, fifth, and sixth contacts, and a second wiring electrically connected to the first wiring and the first and second contacts.

According to at least one example embodiment, the first pixel includes a first overflow transistor, the second pixel includes a second overflow transistor, the third pixel includes a third overflow transistor, and the fourth pixel includes a fourth overflow transistor.

According to at least one example embodiment, the imaging device includes a third wiring that electrically connects the first overflow transistor to the second overflow transistor, and a fourth wiring that electrically connects the third overflow transistor to the fourth overflow transistor.

According to at least one example embodiment, the third wiring and the fourth wiring are electrically connected to the first wiring and the second wiring.

According to at least one example embodiment, the first contact is electrically connected to drain regions of the first amplification transistor and the second amplification transistor.

At least one example embodiment is directed to a system including a light source, and an imaging device as described herein.

At least one example embodiment is directed to an imaging device including a first pixel including a first photoelectric conversion region, a first reset transistor, and a first amplification transistor, a second pixel adjacent the first pixel and including a second photoelectric conversion region, a second reset transistor, and a second amplification transistor, a first contact coupled to drain regions of the first amplification transistor and the second amplification transistor, and that receives a power supply signal for the first amplification transistor and the second amplification transistor, and a second contact coupled to drain regions of the first reset transistor and the second reset transistor, and that receives the power supply signal for the first reset transistor and the second reset transistor.

DETAILED DESCRIPTION

Figure 1:
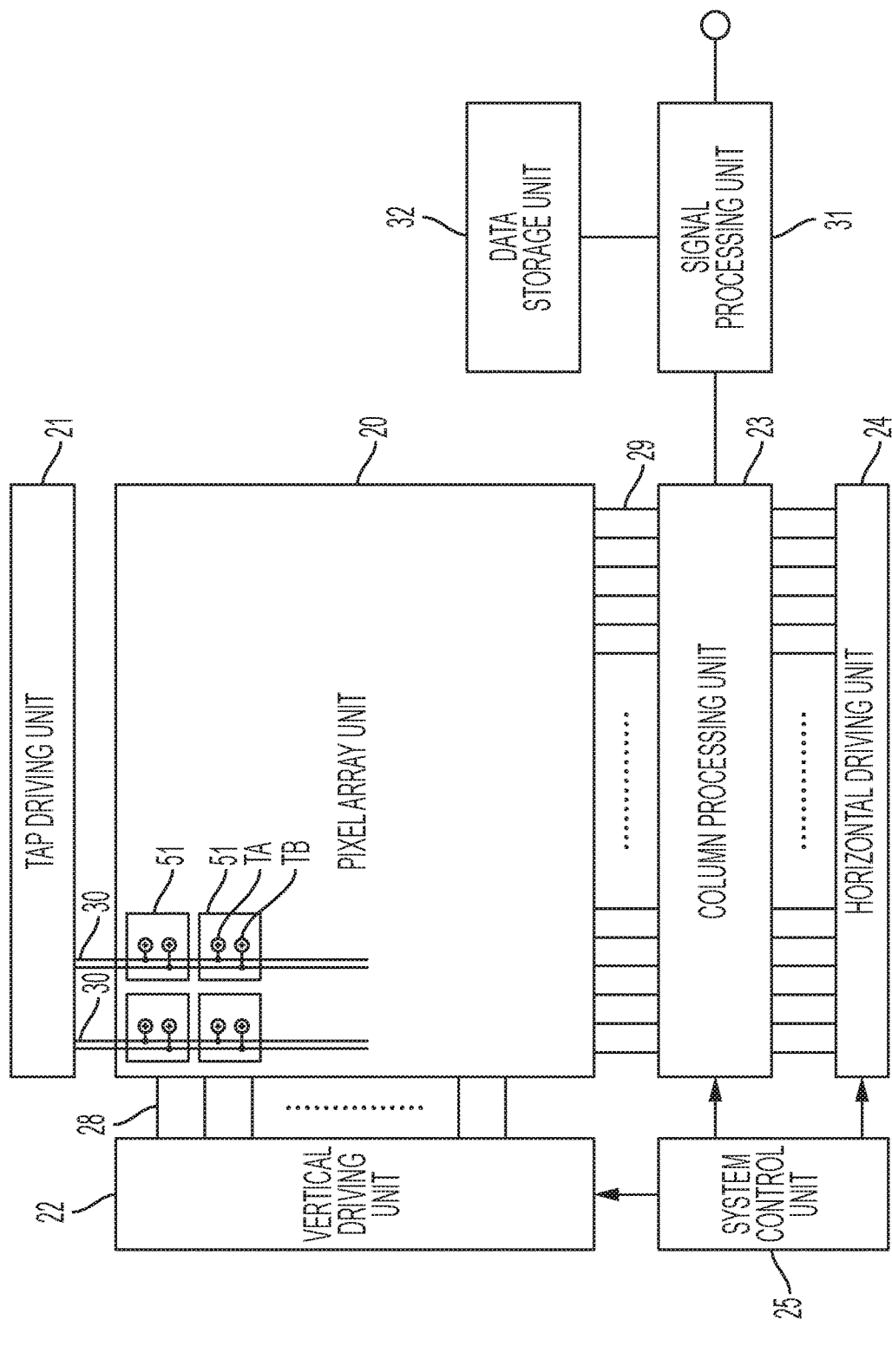
FIG. 1 is a block diagram of an imaging device according to at least one example embodiment.

FIG. 1 is a block diagram of an imaging device according to at least one example embodiment.

The pixel 51 includes a photoelectric conversion region PD, such as a photodiode or other light sensor, transfer transistors TG0 and TG1, floating diffusion regions FD0 and FD1, reset transistors RST0 and RST1, amplification transistors AMP0 and AMP1, and selection transistors SEL0 and SEL1.

The imaging device 1 shown in FIG. 1 may be an imaging sensor of a front or rear surface irradiation type, and is provided, for example, in an imaging apparatus having a ranging function (or distance measuring function).

The imaging device 1 has a pixel array unit (or pixel array or pixel section) 20 formed on a semiconductor substrate (not shown) and a peripheral circuit integrated on the same semiconductor substrate the same as the pixel array unit 20. The peripheral circuit includes, for example, a tap driving unit (or tap driver) 21, a vertical driving unit (or vertical driver) 22, a column processing unit (or column processing circuit) 23, a horizontal driving unit (or horizontal driver) 24, and a system control unit (or system controller) 25.

The imaging device element 1 is further provided with a signal processing unit (or signal processor) 31 and a data storage unit (or data storage or memory or computer readable storage medium) 32. Note that the signal processing unit 31 and the data storage unit 32 may be mounted on the same substrate as the imaging device 1 or may be disposed on a substrate separate from the imaging device 1 in the imaging apparatus.

The pixel array unit 20 has a configuration in which pixels 51 that generate charge corresponding to a received light amount and output a signal corresponding to the charge are two-dimensionally disposed in a matrix shape of a row direction and a column direction. That is, the pixel array unit 20 has a plurality of pixels 51 that perform photoelectric conversion on incident light and output a signal corresponding to charge obtained as a result. Here, the row direction refers to an arrangement direction of the pixels 51 in a horizontal direction, and the column direction refers to the arrangement direction of the pixels 51 in a vertical direction. The row direction is a horizontal direction in the figure, and the column direction is a vertical direction in the figure.

The pixel 51 receives light incident from the external environment, for example, infrared light, performs photoelectric conversion on the received light, and outputs a pixel signal according to charge obtained as a result. The pixel 51 may include a first charge collector that detects charge obtained by the photoelectric conversion PD by applying a predetermined voltage (first voltage) to the pixel 51, and a second charge collector that detects charge obtained by the photoelectric conversion by applying a predetermined voltage (second voltage) to the pixel 51. The first and second charge collector may include tap A and tap B, respectively. Although two charge collectors are shown (i.e., tap A, and tap B), more or fewer charge collectors may be included according to design preferences. The first voltage and the second voltage may be applied to respective areas of the pixel near tap A and tap B to assist with channeling charge toward tap A and tap B during different time periods. The charge is then read out of each tap A and B with transfer signals GD.

Although FIG. 1 illustrates two taps A/B, it should be appreciated that more or fewer taps and charge collectors may be included if desired, which may result in additional signal lines not shown in FIG. 1.

The tap driving unit 21 supplies the predetermined first voltage to the first charge collector of each of the pixels 51 of the pixel array unit 20 through a predetermined voltage supply line 30, and supplies the predetermined second voltage to the second charge collector thereof through the predetermined voltage supply line 30. Therefore, two voltage supply lines 30 including the voltage supply line 30 that transmits the first voltage and the voltage supply line 30 that transmits the second voltage are wired to one pixel column of the pixel array unit 20.

In the pixel array unit 20, with respect to the pixel array of the matrix shape, a pixel drive line 28 is wired along a row direction for each pixel row, and two vertical signal lines 29 are wired along a column direction for each pixel column. For example, the pixel drive line 28 transmits a drive signal for driving when reading a signal from the pixel. Note that, although FIG. 1 shows one wire for the pixel drive line 28, the pixel drive line 28 is not limited to one. One end of the pixel drive line 28 is connected to an output end corresponding to each row of the vertical driving unit 22.

The vertical driving unit 22 includes a shift register, an address decoder, or the like. The vertical driving unit 22 drives each pixel of all pixels of the pixel array unit 20 at the same time, or in row units, or the like. That is, the vertical driving unit 22 includes a driving unit that controls operation of each pixel of the pixel array unit 20, together with the system control unit 25 that controls the vertical driving unit 22.

The signals output from each pixel 51 of a pixel row in response to drive control by the vertical driving unit 22 are input to the column processing unit 23 through the vertical signal line 29. The column processing unit 23 performs a predetermined signal process on the pixel signal output from each pixel 51 through the vertical signal line 29 and temporarily holds the pixel signal after the signal process.

Specifically, the column processing unit 23 performs a noise removal process, a sample and hold (S/H) process, an analog to digital (AD) conversion process, and the like as the signal process.

The horizontal driving unit 24 includes a shift register, an address decoder, or the like, and sequentially selects unit circuits corresponding to pixel columns of the column processing unit 23. The column processing unit 23 sequentially outputs the pixel signals obtained through the signal process for each unit circuit, by a selective scan by the horizontal driving unit 24.

The system control unit 25 includes a timing generator or the like that generates various timing signals and performs drive control on the tap driving unit 21, the vertical driving unit 22, the column processing unit 23, the horizontal driving unit 24, and the like, on the basis of the various generated timing signals.

The signal processing unit 31 has at least a calculation process function and performs various signal processing such as a calculation process on the basis of the pixel signal output from the column processing unit 23. The data storage unit 32 temporarily stores data necessary for the signal processing in the signal processing unit 31. The signal processing unit 31 may control overall functions of the imaging device 1. For example, the tap driving unit 21, the vertical driving unit 22, the column processing unit 23, the horizontal driving unit 24, and the system control unit 25, and the data storage unit 32 may be under control of the signal processing unit 31. The signal processing unit or signal processor 31, alone or in conjunction with the other elements of FIG. 1, may control all operations of the systems discussed in more detail below with reference to the accompanying figures. Thus, the terms "signal processing unit" and "signal processor" may also refer to a collection of elements 21, 22, 23, 24, 25, and/or 31. A signal processor according to at least one example embodiment is capable of processing color information to produce a color information and depth information to produce a depth image.

Figure 2:
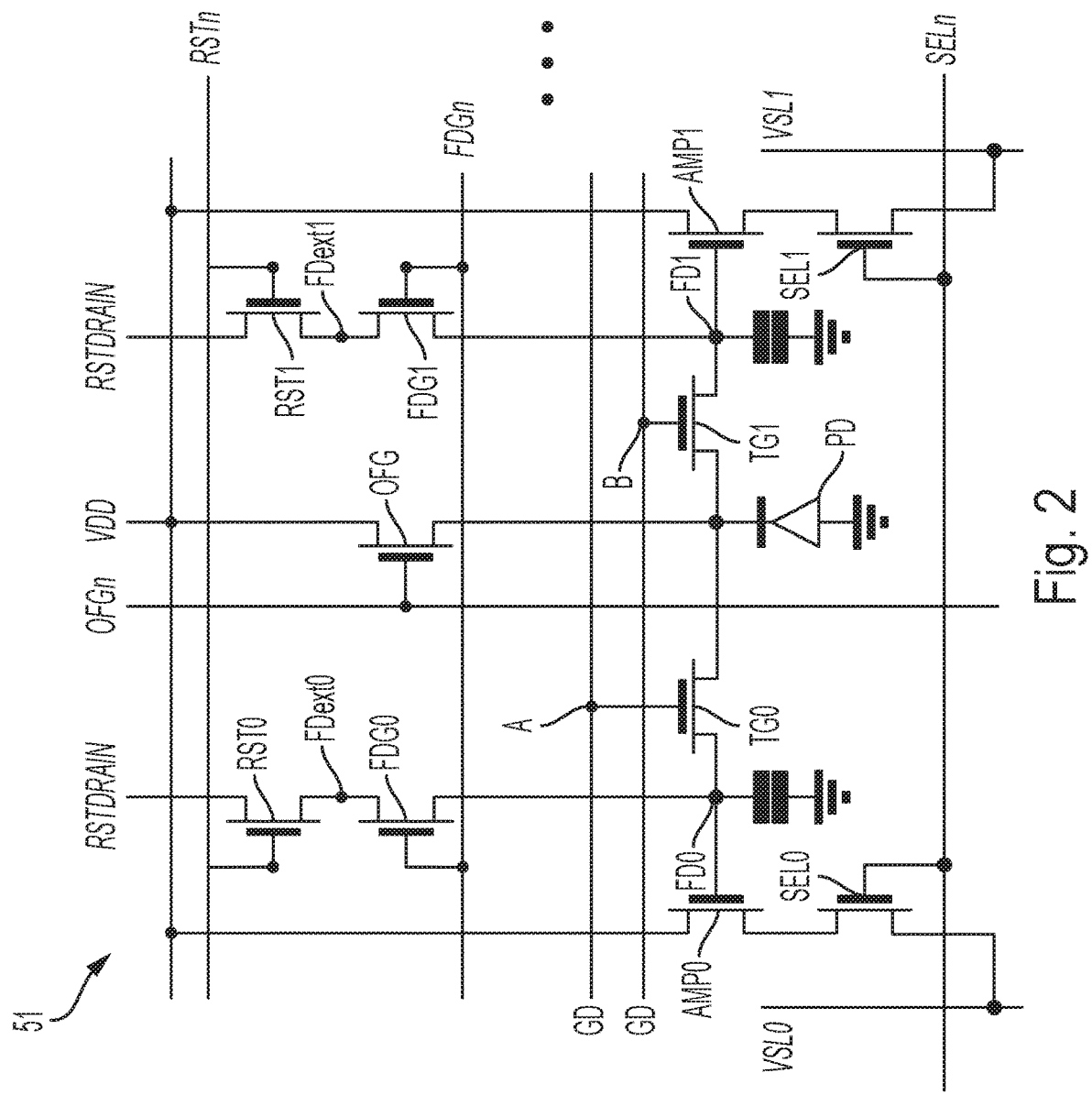
FIG. 2 illustrates an example schematic of a pixel from FIG. 1.

FIG. 2 illustrates an example schematic of a pixel 51 from FIG. 1. The pixel 51 includes a photoelectric conversion region PD, such as a photodiode or other light sensor, transfer transistors TG0 and TG1, floating diffusion regions FD0 and FD1, reset transistors RST0 and RST1, amplification transistors AMP0 and AMP1, and selection transistors SEL0 and SEL1. The pixel 51 may further include an overflow transistor OFG, transfer transistors FDG0 and FDG1, and floating diffusion regions FD0ext and FD1ext.

The pixel 51 may be driven according to control signals or transfer signals GD applied to gates or taps A/B of transfer transistors TG0/TG1, reset signal RSTDRAIN, overflow signal OFGn, power supply signal VDD, selection signal SELn, and vertical selection signals VSL0 and VSL1. These signals are provided by various elements from FIG. 1, for example, the tap driver 21, vertical driver 22, system controller 25, etc.

As shown in FIG. 2, the transfer transistors TG0 and TG1 are coupled to the photoelectric conversion region PD and have taps A/B that transfer charge as a result of applying transfer signals.

These transfer signals GD may have different phases relative to a phase of a modulated signal from a light source (e.g., phases that differ 0 degrees, 90 degrees, 180 degrees, and/or 270 degrees, or alternatively, phases that differ by 120 degrees). The transfer signals may be applied in a manner that allows for depth information (or pixel values) to be captured in a desired number of frames (e.g., one frame, two frames, four frames, etc.). One of ordinary skill in the art would understand how to apply the transfer signals in order to use the collected charge to calculate a distance to an object. In at least one example embodiment, other transfer signals may be applied in a manner that allows for color information to be captured for a color image.

It should be appreciated that the transfer transistors FDG0/FDG1 and floating diffusions (or floating diffusion extensions) FD0ext/FD1ext are included to expand the charge capacity of the pixel 51, if desired. However, these elements may be omitted or not used, if desired. The overflow transistor OFG is included to transfer overflow charge from the photoelectric conversion region PD, but may be omitted or unused if desired. Further still, if only one tap is desired, then elements associated with the other tap may be unused or omitted (e.g., TG1, FD1, FDG1, RST1, SEL1, AMP1).

Here, it should be appreciated that the pixel 51 includes identical sets of pixel elements that may be further replicated for each pixel 51 if desired. For example, elements TG0, FD0, FDG0, FD0ext, RST0, SEL0, AMP0, VSL0 are considered as a first set of pixel elements, while TG1, FD1, FDG1, FD1ext, RST1, SEL1, AMP1, and VSL1 are a second set of pixel elements that have the same structures, connections to one another, and functions as those in the first set of pixel elements. N sets of pixel elements TGn, FDn, FDnext, FDGn, RSTn, SELn, AMPn, and VSLn may be included as indicated by the ellipsis in FIG. 2.

Example embodiments will now be described with reference to FIGS. 3-25, which relate to pixel layouts that share one or more contacts for supplying power to transistors of the pixels to reduce an overall footprint of an imaging device, reduce manufacturing complexity by reducing a number of wirings across the imaging device, and/or reduce parasitic capacitance caused by the wirings.

It should be understood that FIGS. 3-23 show substantially accurate relative positional relationships of the elements depicted therein and can be relied upon as support for such positional relationships. For example, the figures provide support for selection transistors SEL and amplification transistors AMP being aligned with one another in a vertical direction, while transistors FDG and RST are aligned with one another in the vertical direction. As another example, the figures provide support for a transistor on a right side of a figure being aligned with a transistor on a left side of a figure in the horizontal direction. As yet another example, the figures are generally accurate with respect to showing positions of overlapping elements.

In addition, where reference to general element or set of elements is appropriate instead of a specific element, the description may refer to the element or set of elements by its root term. For example, when reference to a specific transfer transistor TG0 or TG1 is not necessary, the description may refer to the transfer transistor(s) "TG."

Further, it should be appreciated that FIGS. 3-25 include unlabeled elements such as wirings in various wiring layers that are generally used to match capacitances between floating diffusion regions and/or make electrical connections between other elements of the imaging device 1 using vias depicted as boxes with an "x."

Figure 3:
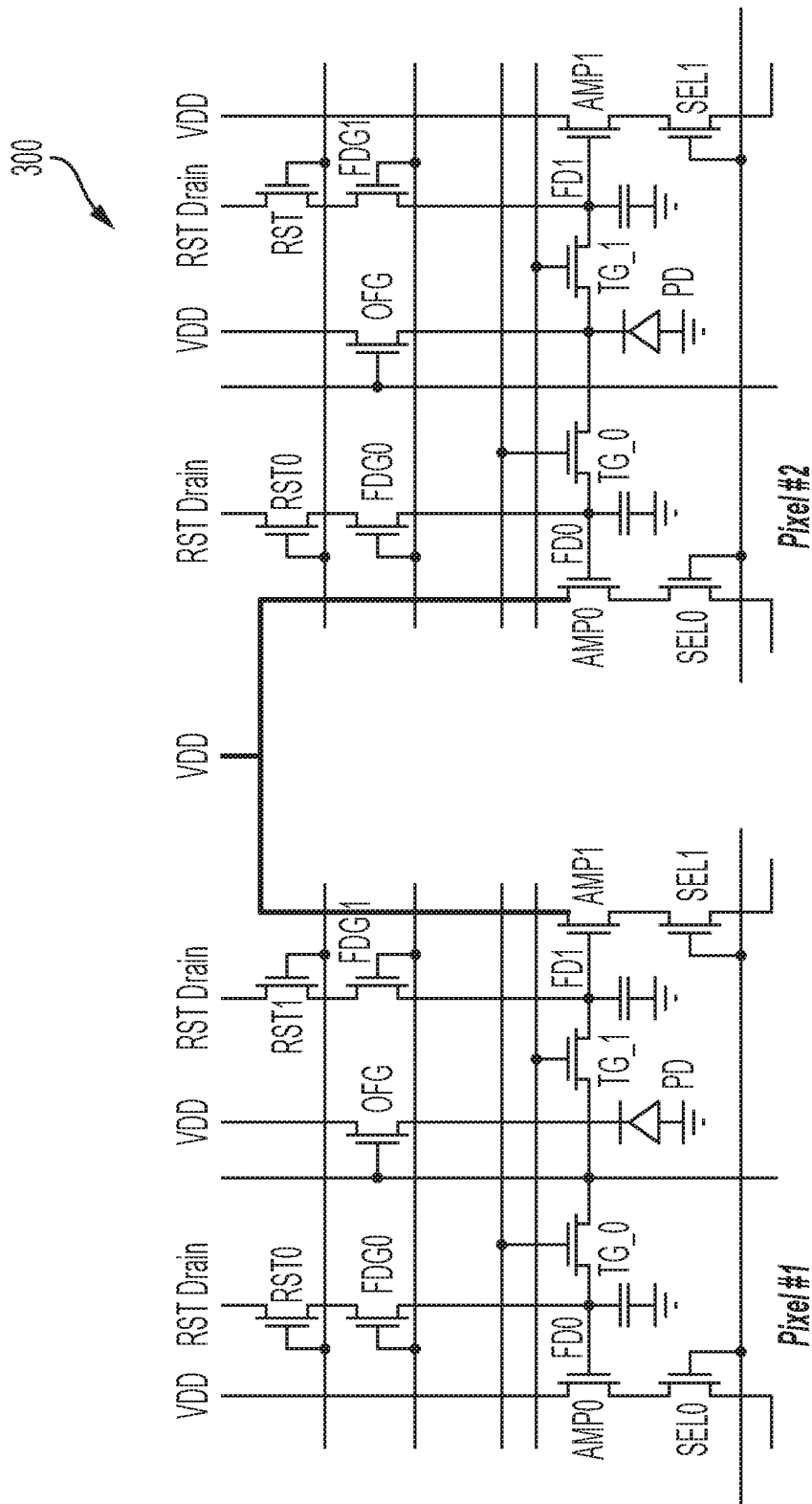
FIG. 3 illustrates a schematic of pixels that are connected in the same configuration as in FIG. 2
Figure 4:
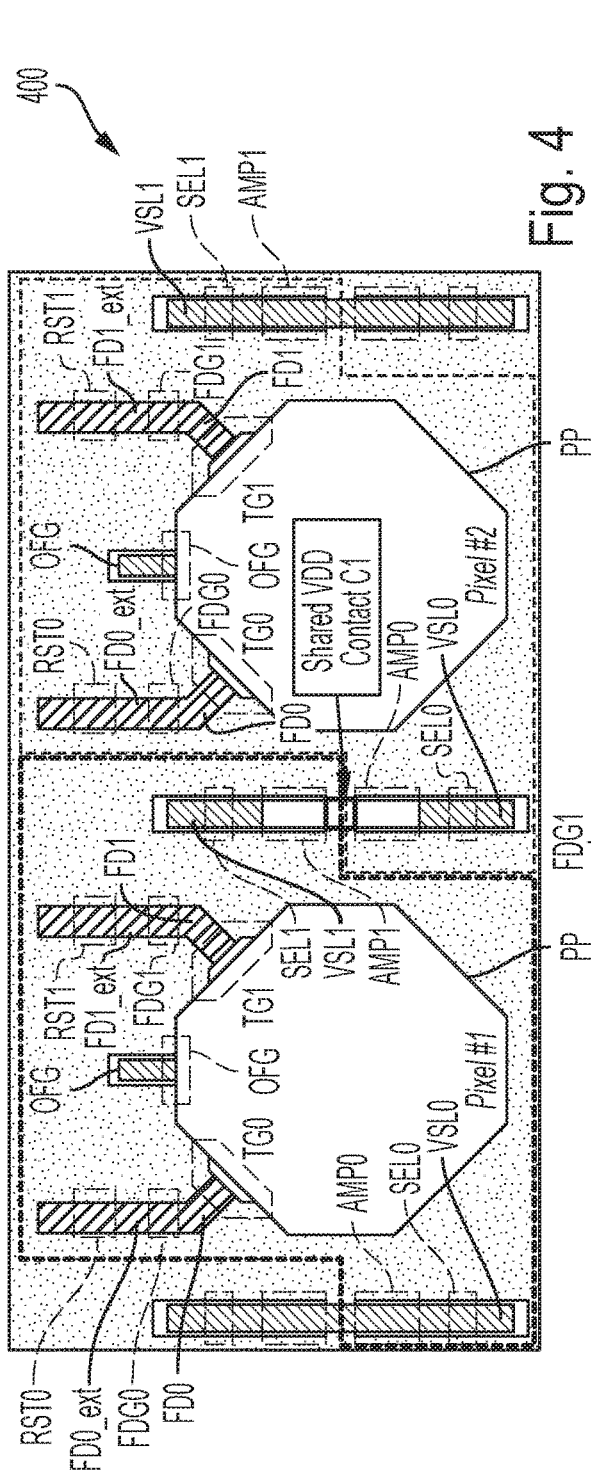
FIG. 4 illustrates an example layout for the pixels in the schematic of FIG. 3.
Figure 5:
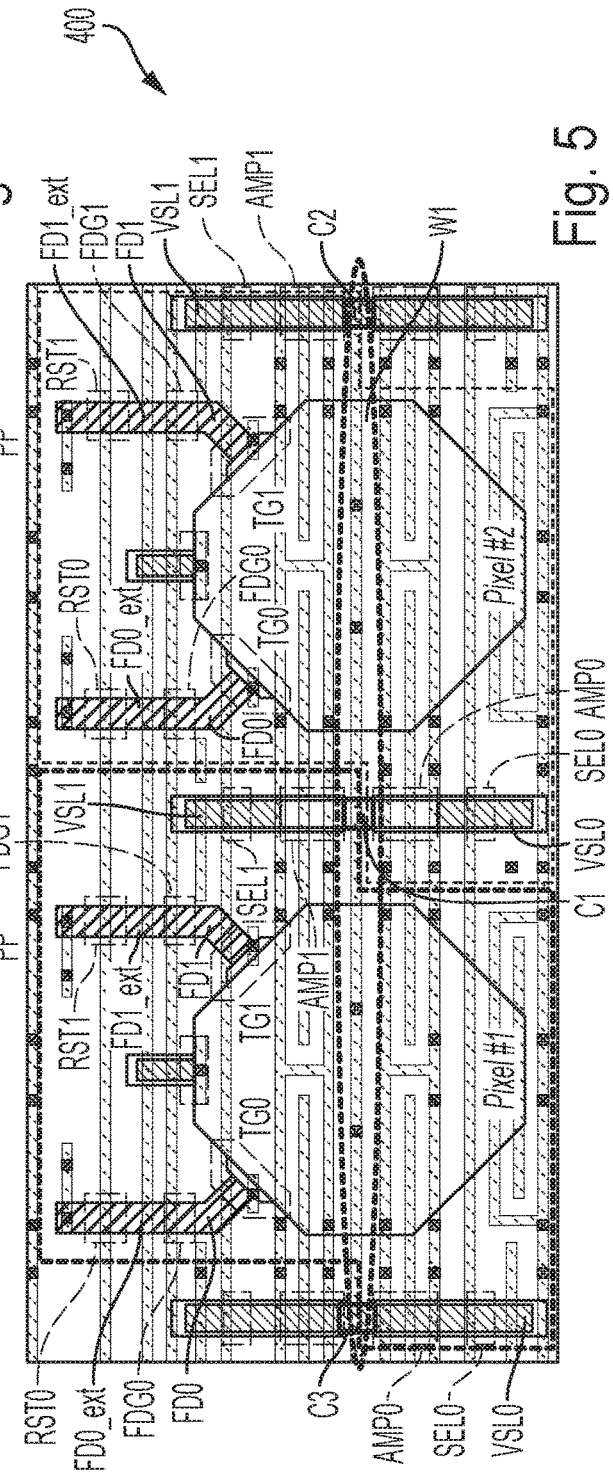
FIG. 5 illustrates the example layout of FIG. 4 in more detail.

FIGS. 3-5 illustrate inventive concepts according to at least one example embodiment.

In more detail, FIGS. 3-5 illustrate example pixels 1 and 2.

FIG. 3 illustrates a schematic 300 of pixels 1 and 2 that are connected in the same configuration as pixel 51 in FIG. 2, where pixels 1 and 2 each include a photoelectric conversion region PD (e.g., a photodiode or single photon avalanche diode (SPAD), transfer transistors TG0/TG1, reset transistors RST0/RST1, an overflow transistor OFG, amplification transistors AMP0/AMP1, selection transistors SEL, floating diffusions FD0/FD1 and FD0ext/FD1ext, and floating diffusion transistors FDG0/FDG1. FIG. 3 emphasizes that pixels 1 and 2 share a same contact to a power supply VDD for amplification transistors AMP0/AMP1. For example, amplification transistor AMP0 shares a contact to VDD with an amplification transistor AMP 1 of pixel 1

FIG. 4 illustrates an example layout 400 for the pixels 1 and 2 in the schematic of FIG. 3. As shown in FIG. 4, pixels 1 and 2 share a same VDD contact C1 for respective amplification transistors AMP0 and AMP1. That is, neighboring pixels in a same row share a VDD contact. However, it should be understood that the phases of transfer signals received by pixels 1 and 2 at transfer transistors TG0 and TG1 of each pixel may be different.

FIG. 5 illustrates the example layout 400 of FIG. 4 in more detail. For example, FIG. 5 illustrates the layout 400 with an M2 layer metal wiring layer of the imaging device 1. As shown, the M2 wiring layer includes a wiring W1 for electrically connecting the contact C1 with contacts C2 and C3 which are connected to VDD nodes for amplification transistors AMP of pixels 1 or 2 and amplification transistors AMP for neighboring unillustrated pixels in the same row. For example, contact C2 provides VDD to amplification transistor AMP1 of pixel 2 and an amplification transistor AMP0 of a pixel to the right of pixel 2, while contact C3 provides VDD to amplification transistor AMP0 of pixel 1 and an amplification transistor AMP1 of a pixel to the left of pixel 1. The wiring W1 may connect the VDD nodes of amplification transistors AMP for an entire row of pixels.

Figures 11, 12:
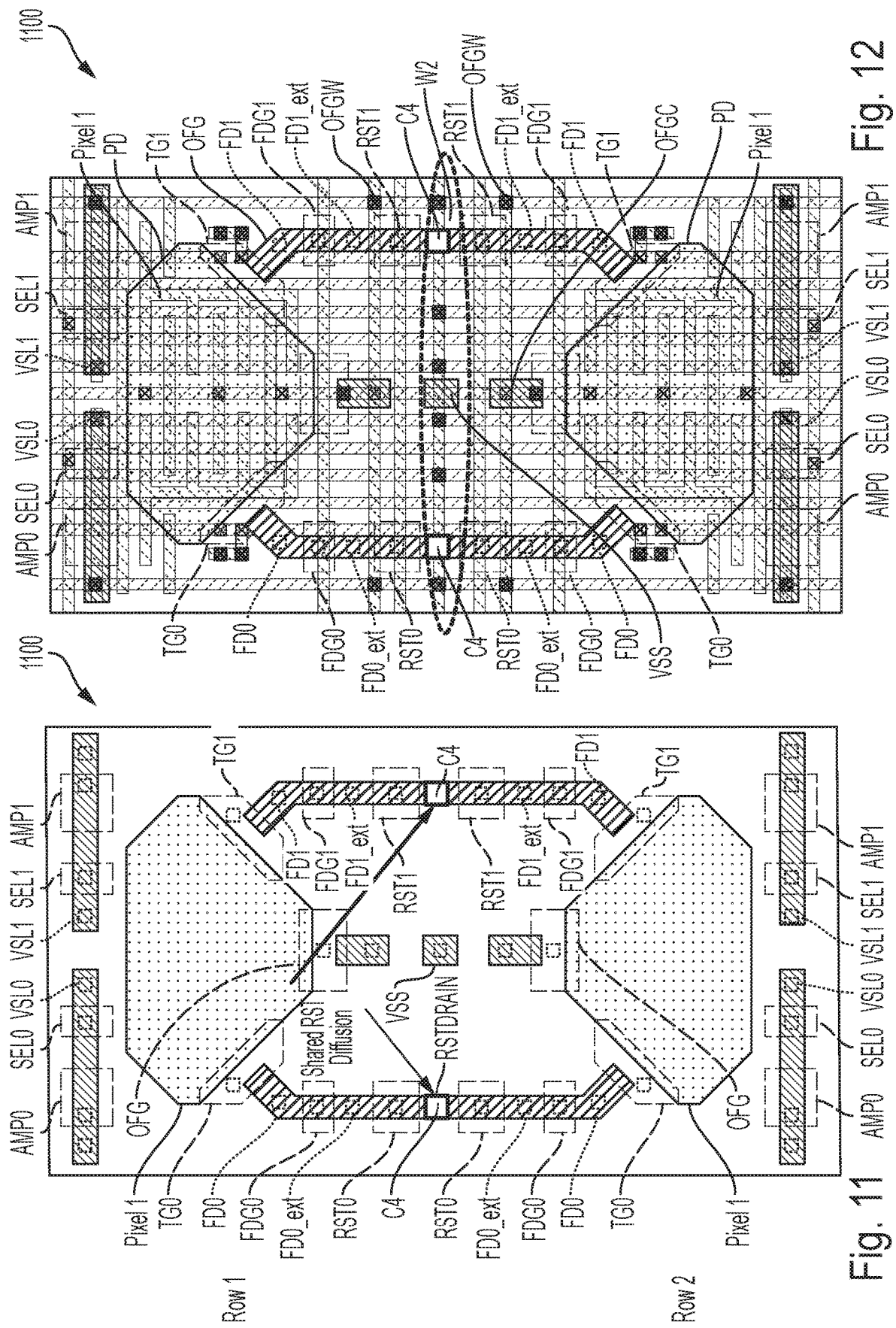
FIG. 11 illustrates an example layout for the pixels in the schematic of FIG. 10.
FIG. 12 illustrates the layout in FIG. 11 in more detail according to at least one example embodiment.
Figure 13:
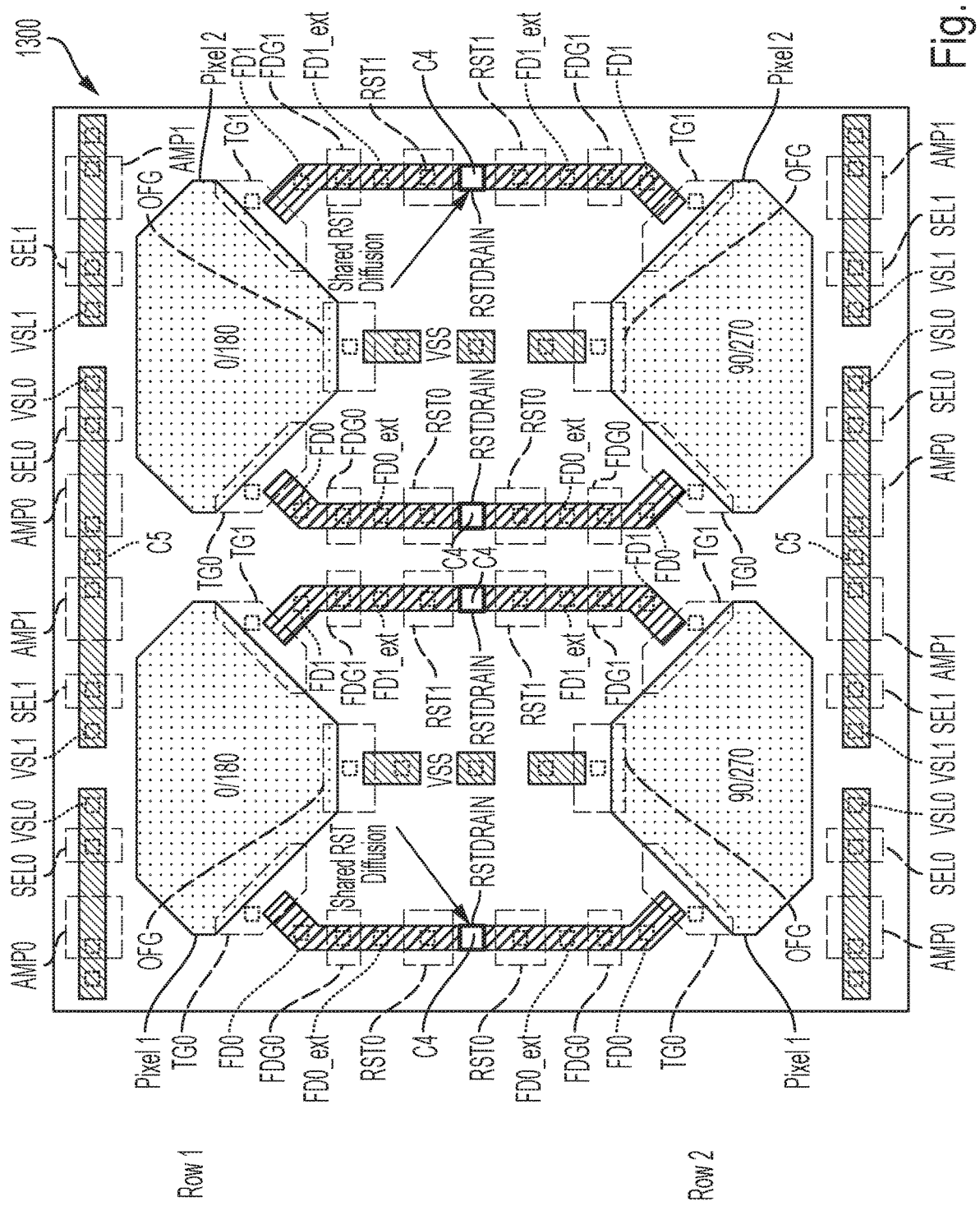
FIG. 13 illustrates an example layout for the pixel schematic in FIG. 10 for pixels in two rows according to at least one example embodiment.

FIG. 5 further illustrates unlabeled wirings in the M2 wiring layer that are generally used to match capacitances between floating diffusion regions, make electrical connections between other elements of each pixel 1 and 2 using vias depicted as boxes with an "x," and/or assist with shielding elements from interference caused by incident light and/or signal lines (in this case, the wirings may be grounded). For example, although not explicitly shown, it should be appreciated that an M3 wiring layer may include a plurality of vertical wirings (e.g., signal lines) that overlap the pixels 1 and 2 and that carry electrical signals to elements of each pixel 1 and 2 that may cause interference that is eliminated or reduced by the presence of the unlabeled grounded wirings in the M2 wiring layer. FIGS. 12 and 13 include examples of signal lines that extend in the vertical direction and that are located in the M3 wiring layer In view of FIGS. 3-5, it should be understood that the illustrated pixel layout for pixels 1 and 2 may be repeated for a remainder of the pixels in the imaging device such that shared VDD contacts in a row of pixels are electrically connected to a same wiring W1. In addition, all drain ports of transistors (e.g., transistors RST, OFG, AMP) in the pixels of the row may be connected to a common port through contacts to one or more wiring layers M2 and/or M3.

Figure 6:
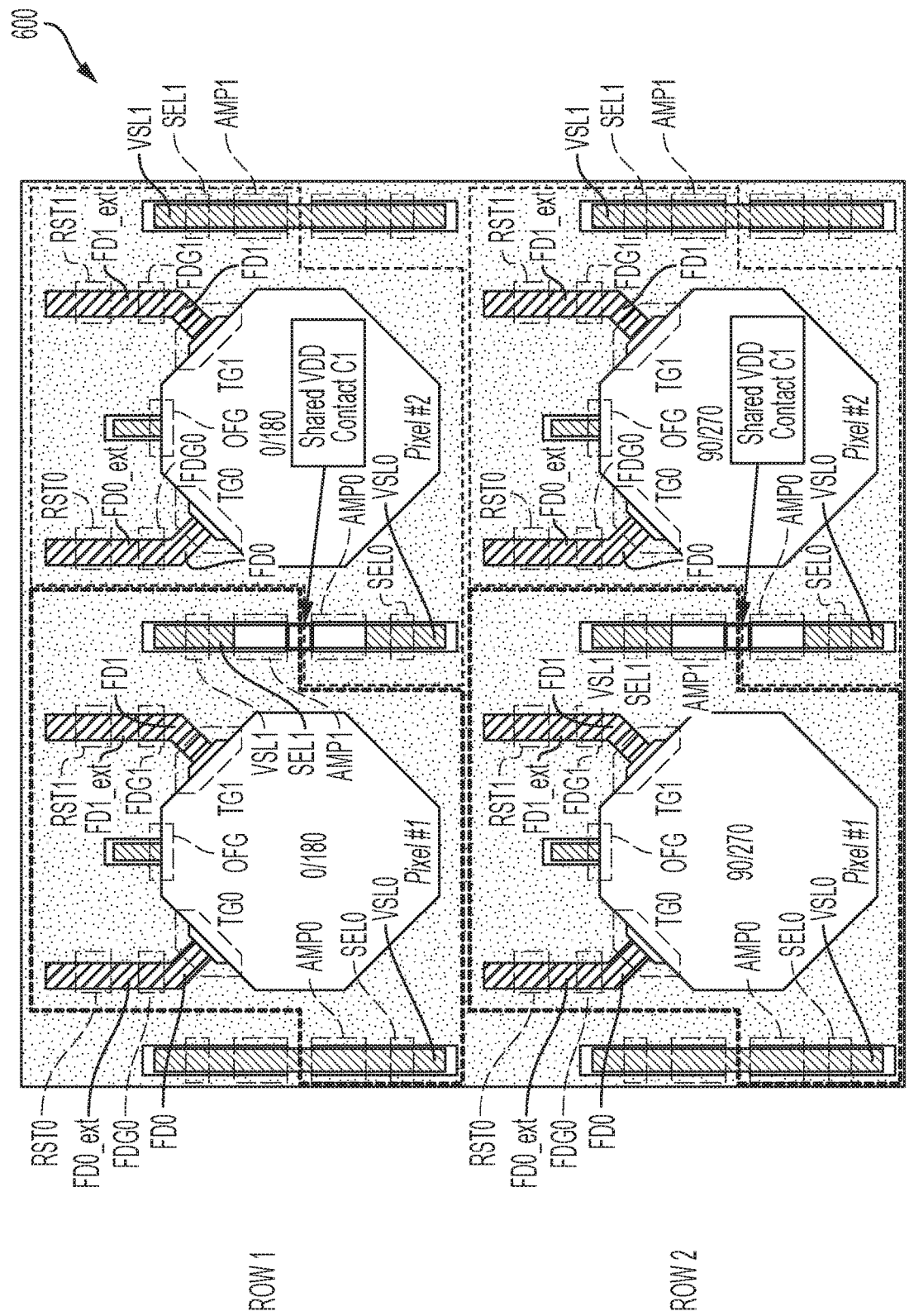
FIG. 6 illustrates an example layout for the pixel schematic in FIG. 3 for pixels in two rows according to at least one example embodiment.
Figure 7:
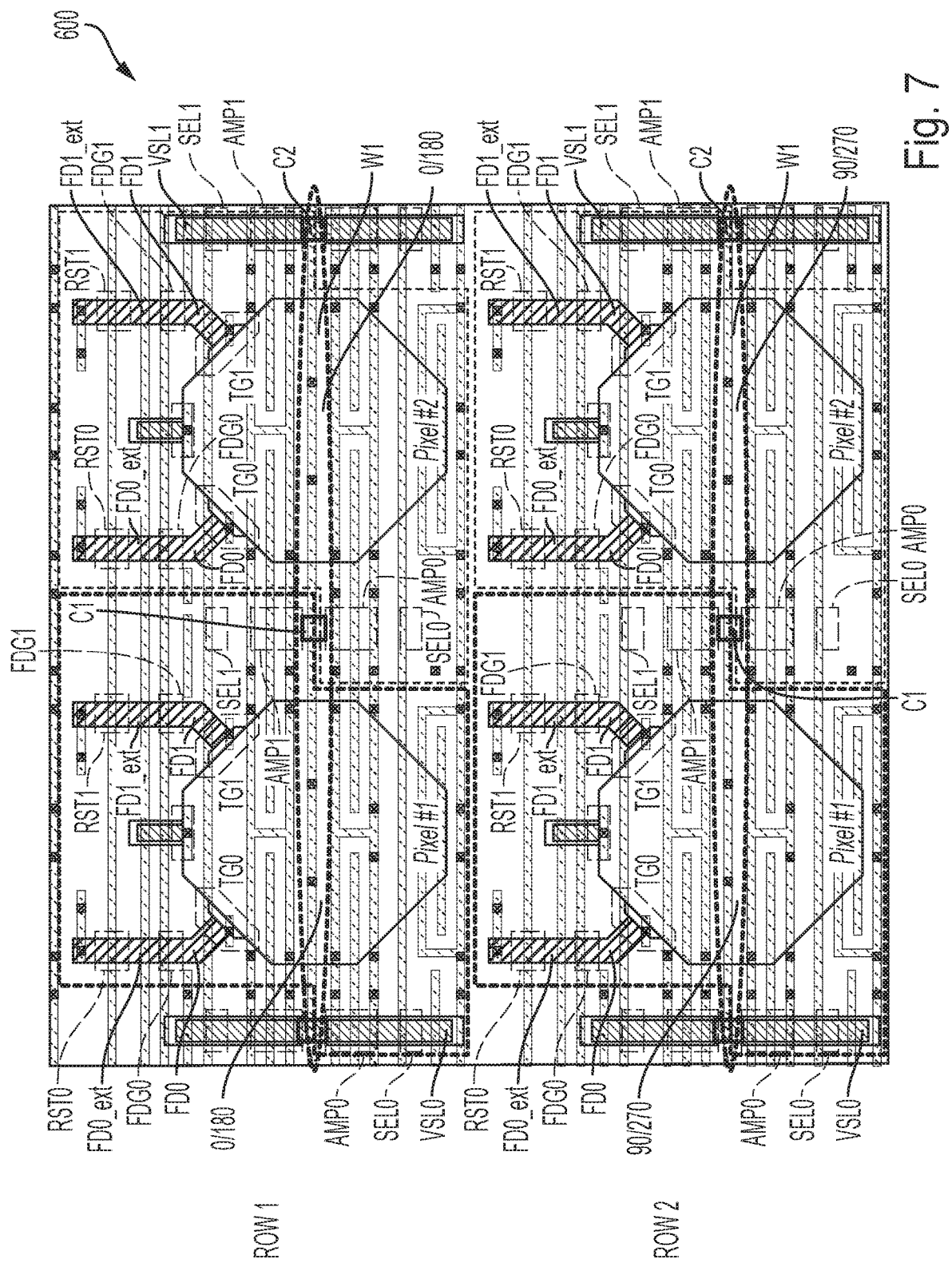
FIG. 7 illustrates the layout in FIG. 6 in more detail according to at least one example embodiment.

FIGS. 6 and 7 illustrate an example layout 600 for the pixel schematic in FIG. 3 for pixels in two rows according to at least one example embodiment. With reference to FIG. 6, it should be appreciated that pixels 1 and 2 in row 1 share a same VDD contact when the pixels 1 and 2 receive a same phase transfer signal, where the transfer signal is applied to transfer transistor TG0 or TG1 of a pixel and has a phase relationship that is determined based on an optical signal or drive signal that drives a light source. For example, in a case where transfer transistor TG0 or TG1 of each pixel 1 and 2 in row 1 is unused, and pixels 1 and 2 in row both receive transfer signals having a 0 degrees phase difference or 180 degrees phase difference with respect to the optical signal, the pixels may share a VDD contact C1. Likewise, if transfer transistor TG0 or TG1 of pixels 1 and 2 in row 2 are unused, and both pixels 1 and 2 in row 2 receive a same phase transfer signal (90 degrees or 270 degrees), the pixels 1 and 2 may share a same VDD contact C1. However, a connection to VDD is not shared between pixels that receive different phase transfer signals (a pixel that receives a transfer signal with 0 degrees phase difference does not share a VDD contact with a pixel that receives a transfer signal with phase differences of 90, 180, or 270 degrees).

In another example and with reference to FIG. 6, where both transfer transistors TG0 and TG1 for each pixel 1 and 2 are used, VDD contacts C1 are shared between two pixels that receive transfer signals having same phases that are applied to transfer transistors TG0 and TG1 of each pixel. In operation, a light source emits a pulsed optical signal toward an object, where the pulsed optical signal has a known phase. The pixels of the imaging device receive light reflected from the object and convert the received light into electric charge. This is electric charge is transferred from the transfer transistors TG0 and TG1 to respective floating diffusions FD0 and FD1 according to the transfer signals applied to gates of the transfer transistors TG0 and TG1. In FIG. 6, the transfer signal applied to TG0 in pixels 1 and 2 of row 1 has a phase difference of 0 degrees with respect to the optical signal, while the transfer signal applied to TG1 in pixels 1 and 2 of row 1 has a phase difference of 180 degrees with respect to the optical signal. The transfer signal applied to TG0 in pixels 1 and 2 of row 2 have a phase difference of 90 degrees with respect to the optical signal while the transfer signal applied to TG1 in pixels 1 and 2 of row two have a phase difference of 270 degrees with respect to the optical signal.

The charge transferred to respective floating diffusions upon application of the transfer signals is then read out through remaining transistors such as AMP and SEL. Capturing charge from the PDs in pixels of both rows 1 and 2 in this manner allows for a signal processor (e.g., such as in FIGS. 1 and 2) to determine a distance to the object based on phase differences between the optical signal and the amount of charge collected by the PDs in each phase.

One method for calculating distance is an object is set forth below with Equation (1):

$$\text{Distance} = \frac{C \cdot \Delta T}{2} = \frac{C \cdot \alpha}{4\pi f_{mod}} \quad (1)$$

$$\alpha = \arctan\left(\frac{\phi_1 - \phi_3}{\phi_0 - \phi_2}\right)$$

Here, C is the speed of light, ΔT is the time delay, fmod is the modulation frequency of the emitted light or reference optical signal, φ0 to φ3 are the signal values detected with transfer signals having phase differences from the emitted light 0 degrees, 90 degrees, 180 degrees, and 270 degrees, respectively.

FIG. 7 illustrates the layout 600 of FIG. 6 in more detail. For example, like FIG. 5, FIG. 7 illustrates that wiring layer M2 includes a wiring W1 to connect shared contacts C1 to a power supply VDD. Like FIG. 5, FIG. 7 shows unlabeled wirings in the M2 wiring layer included for the same purpose(s) as those in FIG. 5. In addition, all drain ports of transistors (e.g., RST, OFG, AMP) in the pixels may be connected to a common port through contacts to one or more wiring layers M2 and/or M3.

In FIGS. 6 and 7, it should be appreciated that the shared VDD contacts C1 may be shared between only two pixels in a row and not necessarily shared between pixels of the entire row unless desired.

Figure 8:
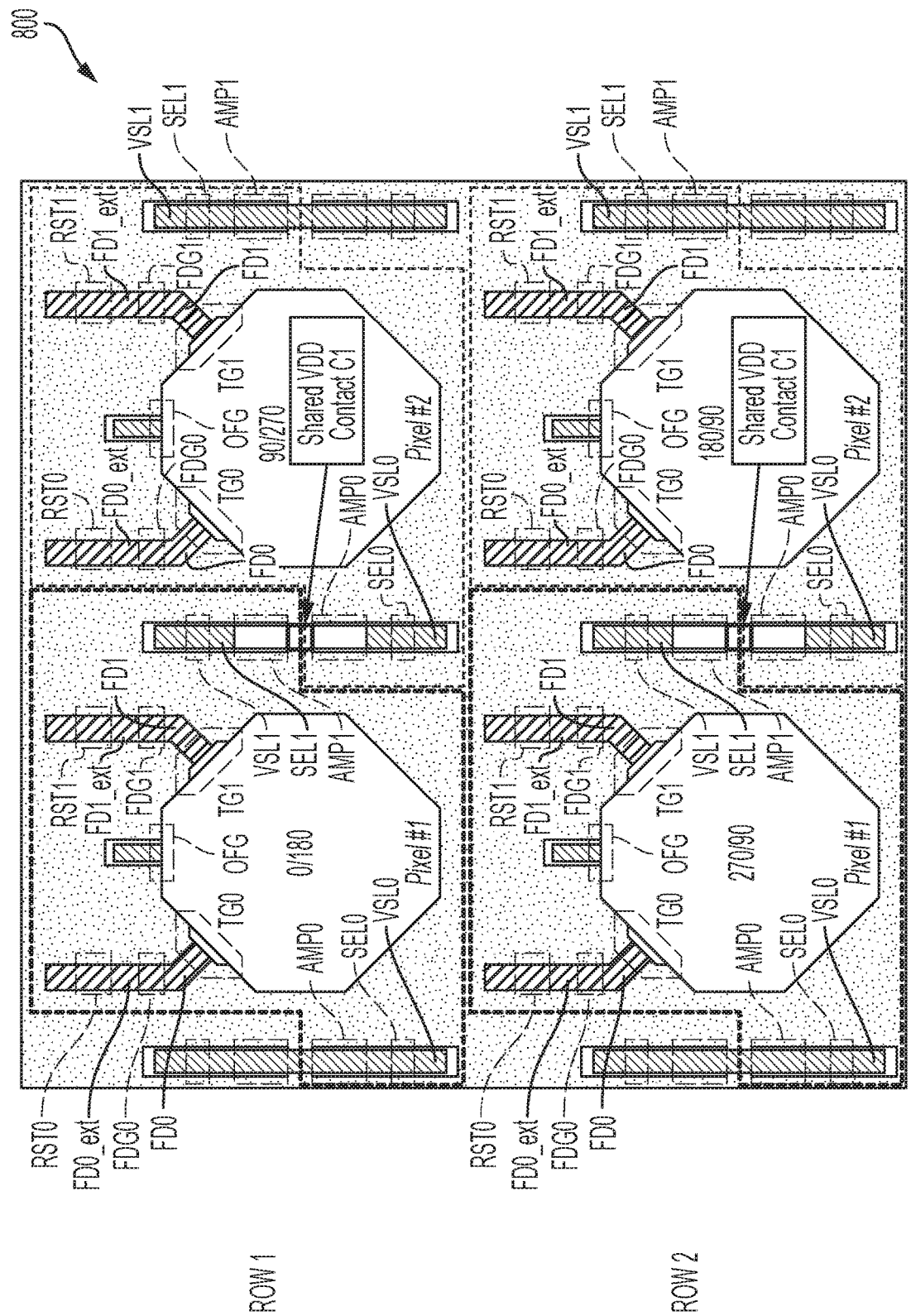
FIG. 8 illustrates an example layout for the pixel schematic in FIG. 3 for pixels in two rows according to at least one example embodiment.
Figure 9:
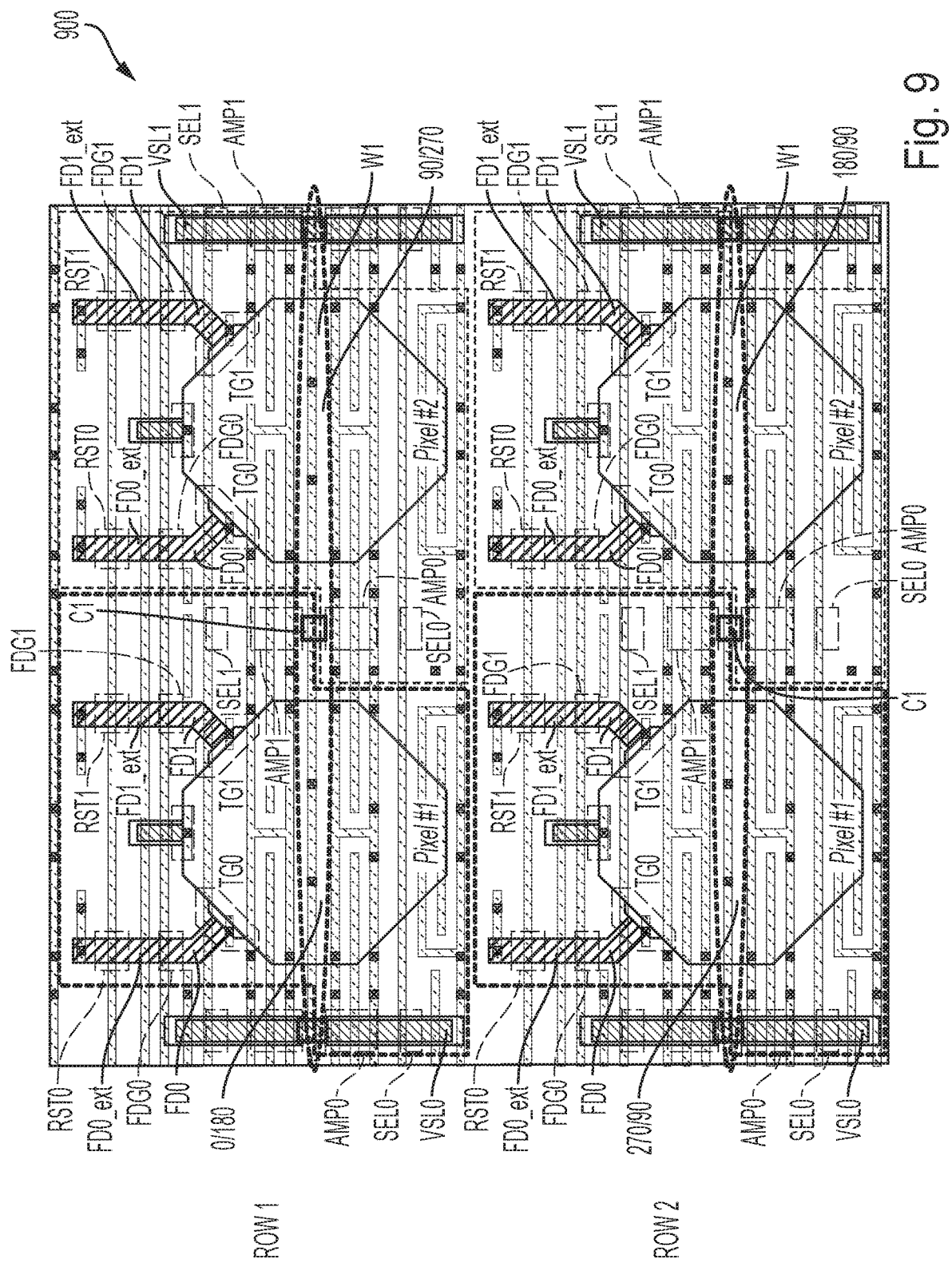
FIG. 9 illustrates the layout in FIG. 8 in more detail according to at least one example embodiment.

FIGS. 8 and 9 illustrate an example layout 800 of the schematic of FIG. 3 for pixels in two rows according to at least one example embodiment. As shown, neighboring pixels 1 and 2 in each row share a same VDD contact C1 as in FIGS. 6 and 7, except that in FIGS. 8 and 9 the neighboring pixels 1 and 2 in each row have different phased transfer signals applied to respective transfer gates TG0 and TG1. For example, TG0 for pixel 1 in row 1 receives a transfer signal that has a 0 degrees phase difference with respect to the optical signal while TG0 for pixel 2 in row 1 receives a transfer signal that has a 90 degrees phase difference with respect to the optical signal, and so on. In addition, all drain ports of transistors (e.g., RST, OFG, AMP) in the pixels may be connected to a common port through contacts to one or more wiring layers M2 and/or M3. Like FIGS. 5 and 7, FIG. 9 shows a wiring W1 in wiring layer M2 that electrically connects to the VDD contact C1. FIG. 9 further shows unlabeled wirings in the M2 wiring layer included for the same purpose(s) as those in FIG. 5. In FIGS. 8 and 9, it should be appreciated that the shared VDD contacts C1 may be shared between only two pixels in a row and not necessarily shared between pixels of the entire row unless desired.

With reference to FIGS. 4-9, it should be appreciated that each pixel 1 and 2 exhibits point symmetry when viewed from a reference point for many or all of the corresponding transistors. For example, if the reference point is a center of a pixel 1 or 2 along a vertical axis, then each reset transistor RST0/RST1 is a same distance from the reference point, each transistor FDG0/FDG1 is a same distance from the reference point, and so on for remaining transistors TG0/TG1, AMP0/AMP1, and SEL0/SEL1 of each pixel 1 and 2.

Figure 10:
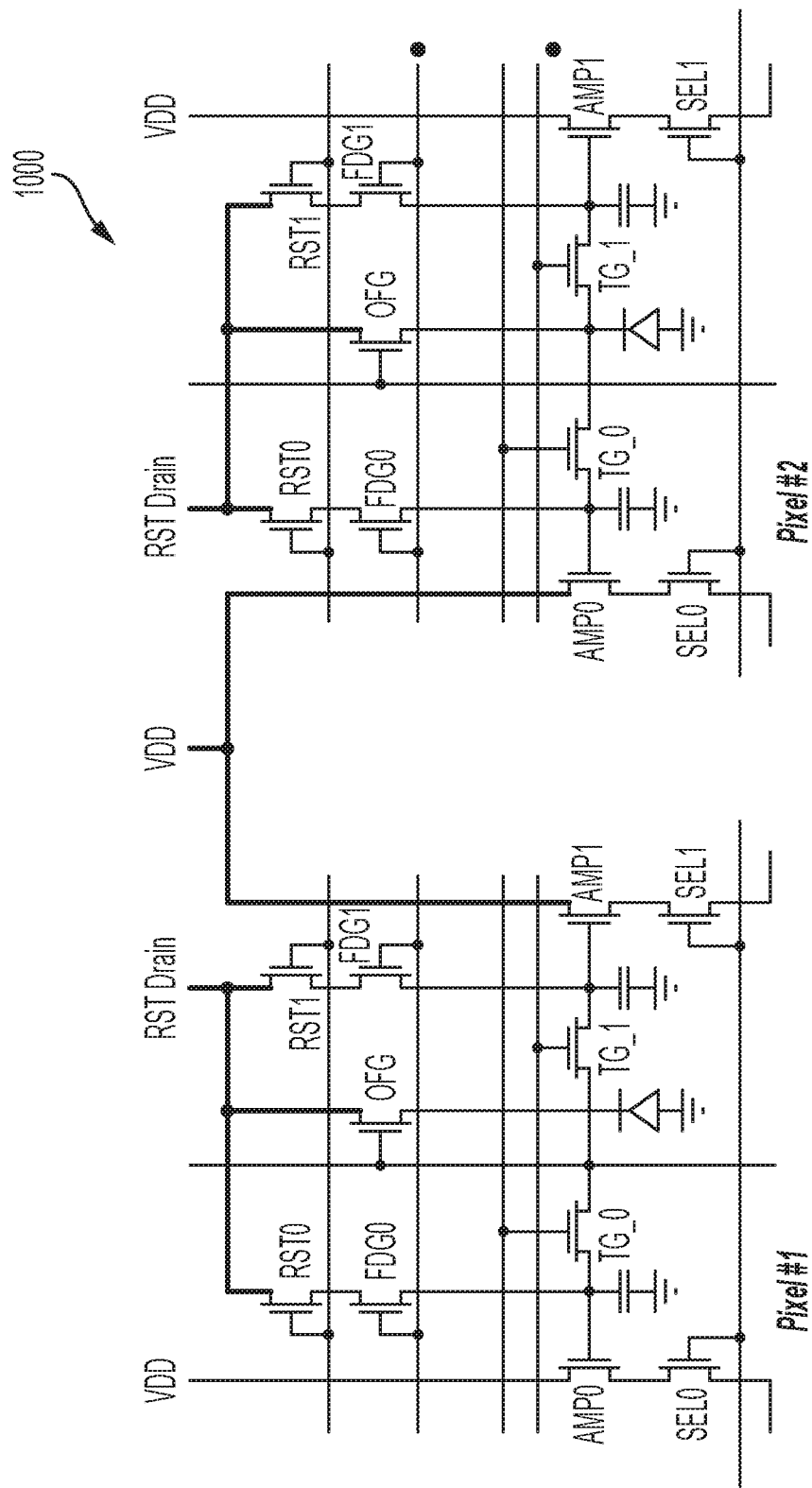
FIG. 10 illustrates an example schematic for pixels of an imaging device according to at least one example embodiment.

FIG. 10 illustrates an example schematic 1000 for two pixels 1 and 2 of an imaging device according to at least one example embodiment. As shown in FIG. 10, amplification transistor 1 of pixel 1 and amplification transistor AMP0 of pixel 2 may share a contact to power supply VDD while reset transistors RST0 and RST1, and overflow transistors OFG of each pixel 1 and 2 may be connected to the same power supply RSTDRAIN. The power supply RSTDRAIN may be the same or different from the power supply VDD.

FIGS. 11 and 12 illustrate an example layout 1100 for the pixels in the schematic of FIG. 10, where FIG. 12 illustrates FIG. 11 in more detail with the addition of one or more wiring layers M2 and/or M3.

As shown in FIGS. 10-12, pixels 1 and 2 in two different rows may share contacts C4 to supply a power supply signal RSTDRAIN to drains of transistors RST1 and RST0. In addition, all drain ports of transistors (e.g., RST, OFG, AMP) in the pixels may be connected to a common port through contacts to one or more wiring layers M2 and/or M3.

FIG. 12 illustrates a wiring W2 in an M2 wiring layer that electrically connects contacts C4 to one another. Further, the overflow transistors OFG of pixels 1 and 2 in different rows may be connected to the contacts C4 through M2 and/or M3 wirings. For example, the overflow transistors OFG of pixels 1 and 2 in different rows may be connected to the contacts C4 through wiring layers M2 and/or M3. In this case, a vertical wiring in (for example, in M3) connects to horizontal wirings OFGW (for example, in M2) to carry the same RSTDRAIN signal to a drain of the overflow transistors OFG through contacts OFGC. Although not necessarily depicted or described, the same connections to overflow transistors OFG to pixels in different rows are true for FIGS. 14, 16, 19, 21, and 23.

In FIG. 12, wirings in wiring layer M2 may generally extend in a horizontal direction while wirings in wiring layer M3 may generally extend in the vertical direction. The same or similar vertical wirings in wiring layer M3 may be included for FIGS. 5, 7, and 9.

In view of FIGS. 11-12, it should be appreciated that the group of four pixels has multiple forms of symmetry. For example, symmetry exists for all transistors and/or M2/M3 wirings along a horizontal axis that passes through a center of each pixel at contacts C4. Symmetry further exists for all transistors and/or M2/M3 wirings in a vertical direction that passes through a center of a contact that receives a signal VSS (e.g., a ground signal VSS). The same symmetry exists when the pixels 1 and 2 are arrayed as in FIGS. 13-16 and 18-23, which gives the array multiple forms of symmetry along vertical and horizontal axes.

Figure 14:
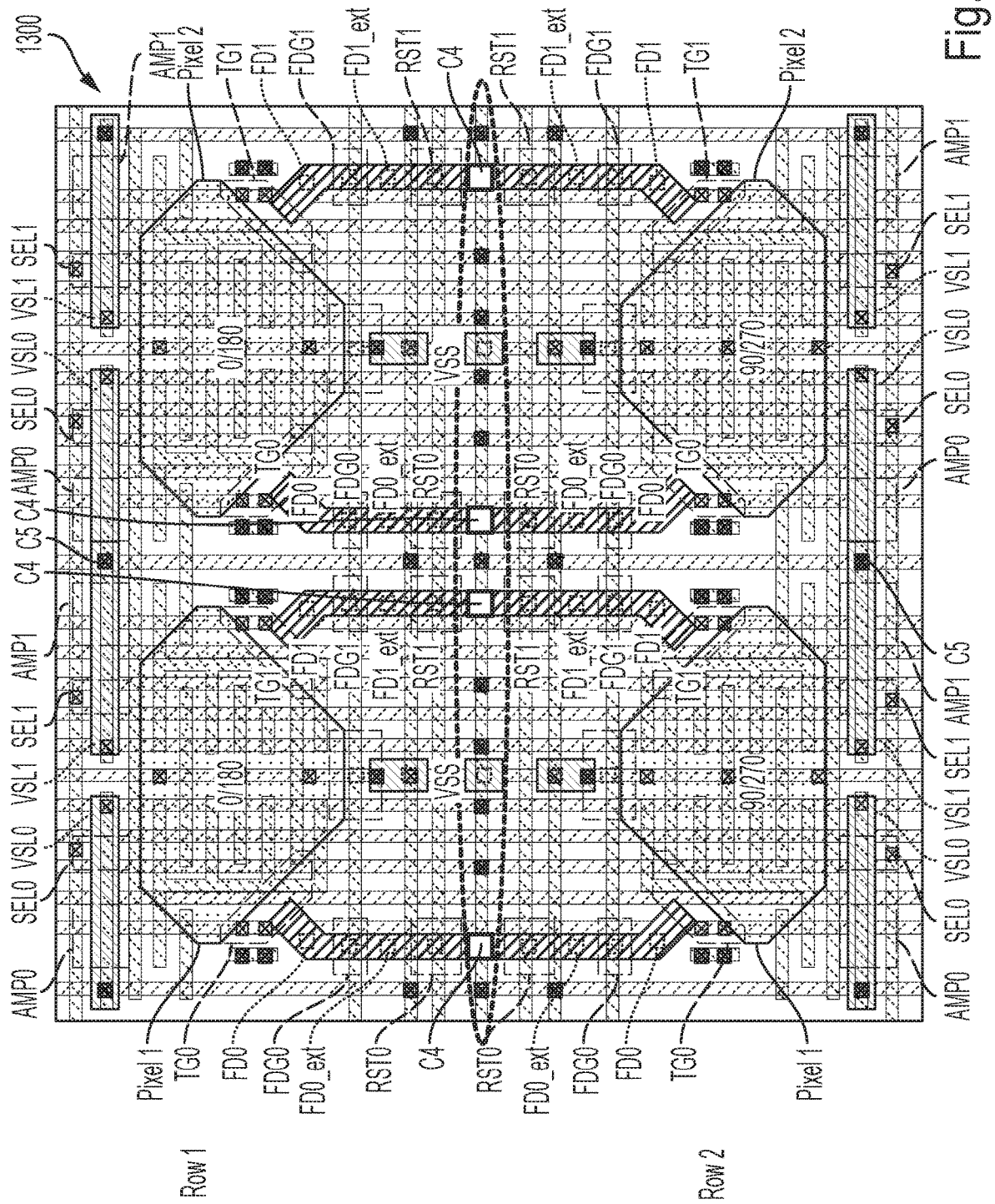
FIG. 14 illustrates the layout in FIG. 13 in more detail according to at least one example embodiment.

FIGS. 13 and 14 illustrate an example layout 1300 for two rows of pixels utilizing the schematic of FIG. 10 according to at least one example embodiment. Like FIGS. 6 and 7, FIGS. 13 and 14 illustrate the different phases for transfer signals applied to respective transfer transistors TG in the pixels. In FIGS. 13 and 14, contacts C4 to RSTDRAIN are shared vertically between pixels that receive transfer signals with a 90 degree phase difference from one another compared to the optical signal. In addition, all drain ports of transistors (e.g., RST, OFG, AMP) in the pixels may be connected to a common port through contacts to one or more wiring layers M2 and/or M3. Further still, point symmetry exists for corresponding transistors of pixel 1 in row 1 and pixel 2 in row 2. For example, if a reference point is VSS between pixel 1 in row 1 and pixel 1 in row 2, then selection transistor SEL0 in pixel 1 of row 1 is a same distance to the reference point as selection transistor SEL0 in pixel 1 of row 2, and so on for each transistor in vertically adjacent pixels.

FIGS. 13 and 14 further illustrate that amplification transistors AMP1 and AMP0 of neighboring pixels in each row share a VDD contact C5, which is also true for FIGS. 15-23.

Figure 15:
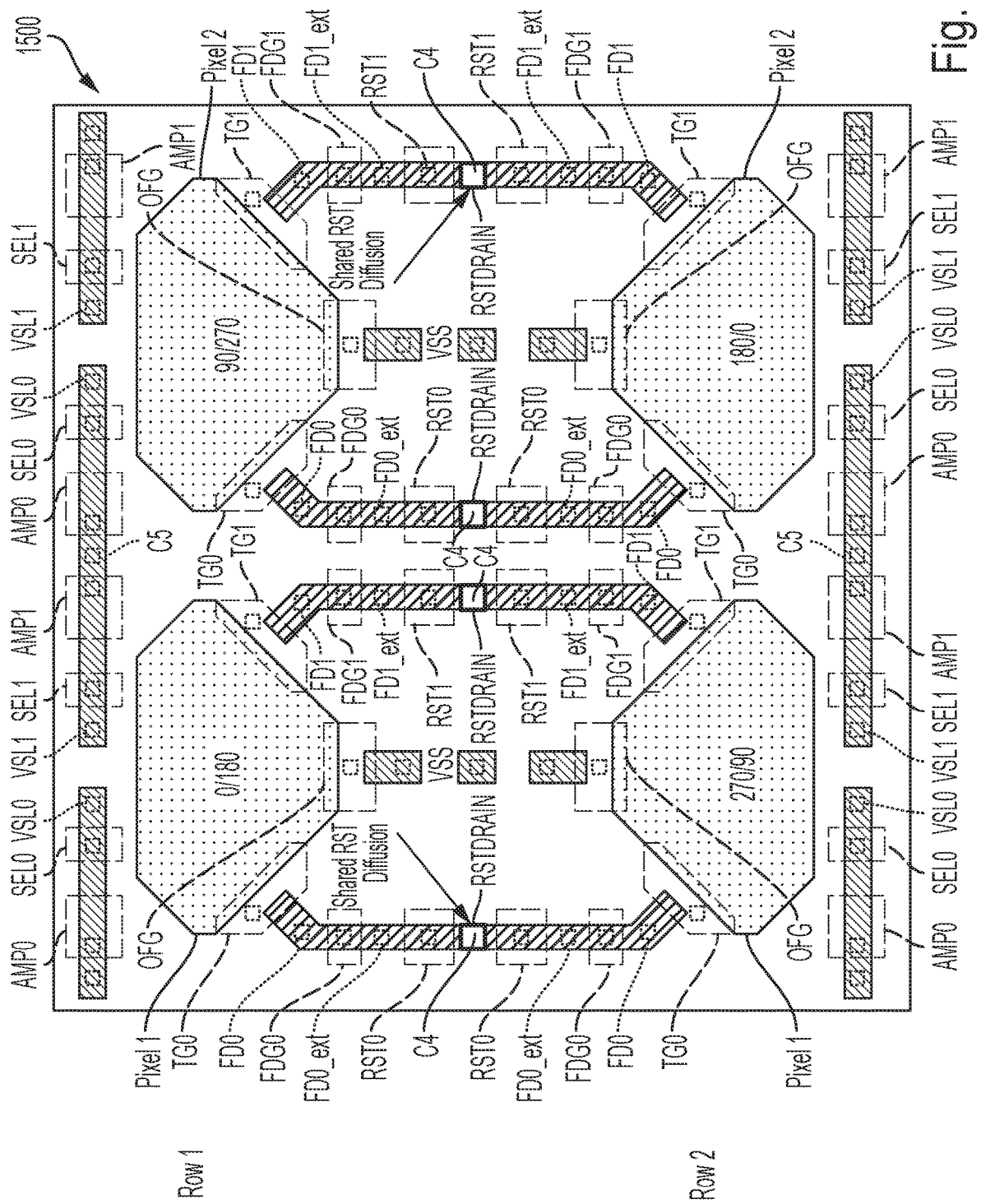
FIG. 15 illustrates an example layout for the pixel schematic in FIG. 10 for pixels in two rows according to at least one example embodiment.
Figure 16:
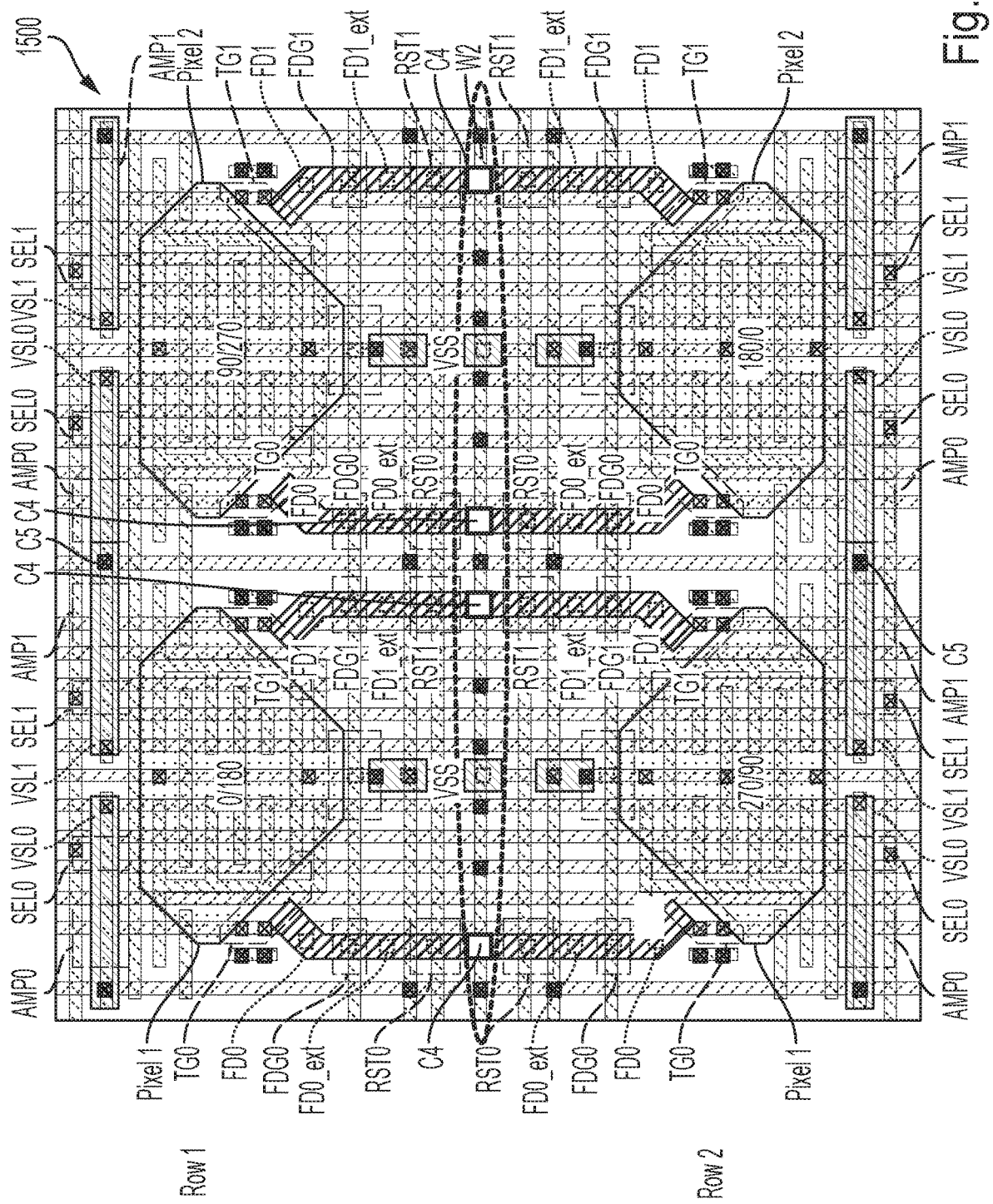
FIG. 16 illustrates the layout in FIG. 15 in more detail according to at least one example embodiment.

FIGS. 15 and 16 illustrate an example layout 1500 for two rows of pixels utilizing the schematic of FIG. 10 according to at least one example embodiment. As in FIGS. 13 and 14, FIGS. 15 and 16 illustrate the different phases for transfer signals applied to respective transfer transistors TG in the pixels. In FIGS. 15 and 16, contacts C4 to RSTDRAIN are shared vertically between RSTDRAINs of pixels that receive transfer signals with the shown phase differences compared to the optical signal. As shown, the phases associated with taps of the right column of pixels are flipped compared to the left column of pixels. In addition, all drain ports of transistors (e.g., RST, OFG, AMP) in the pixels may be connected to a common port through contacts to one or more wiring layers M2 and/or M3.

Figure 17:
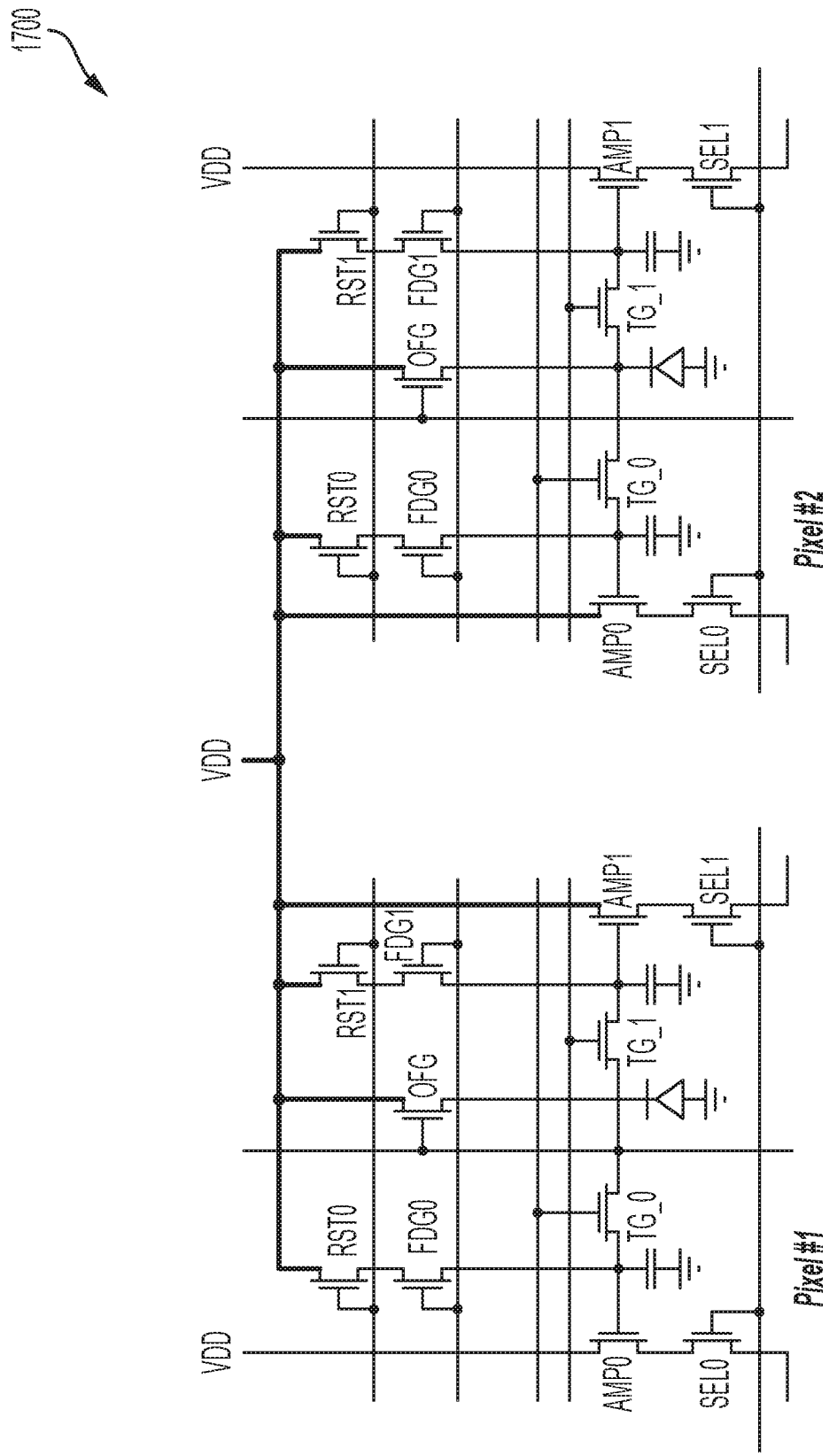
FIG. 17 illustrates an example schematic for pixels of an imaging device according to at least one example embodiment.
Figure 18:
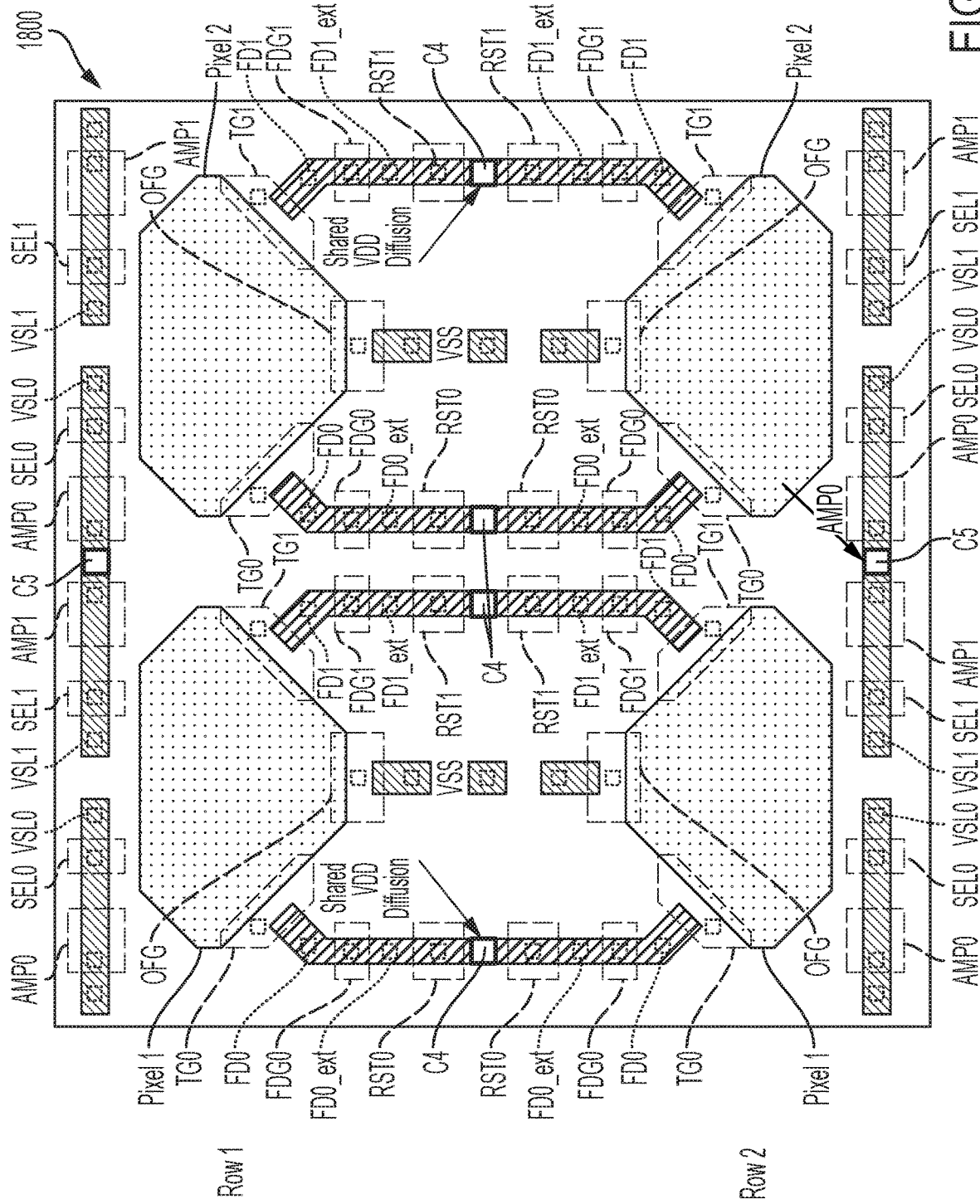
FIG. 18 illustrates an example layout for the pixel schematic in FIG. 17 for pixels in two rows according to at least one example embodiment.
Figure 19:
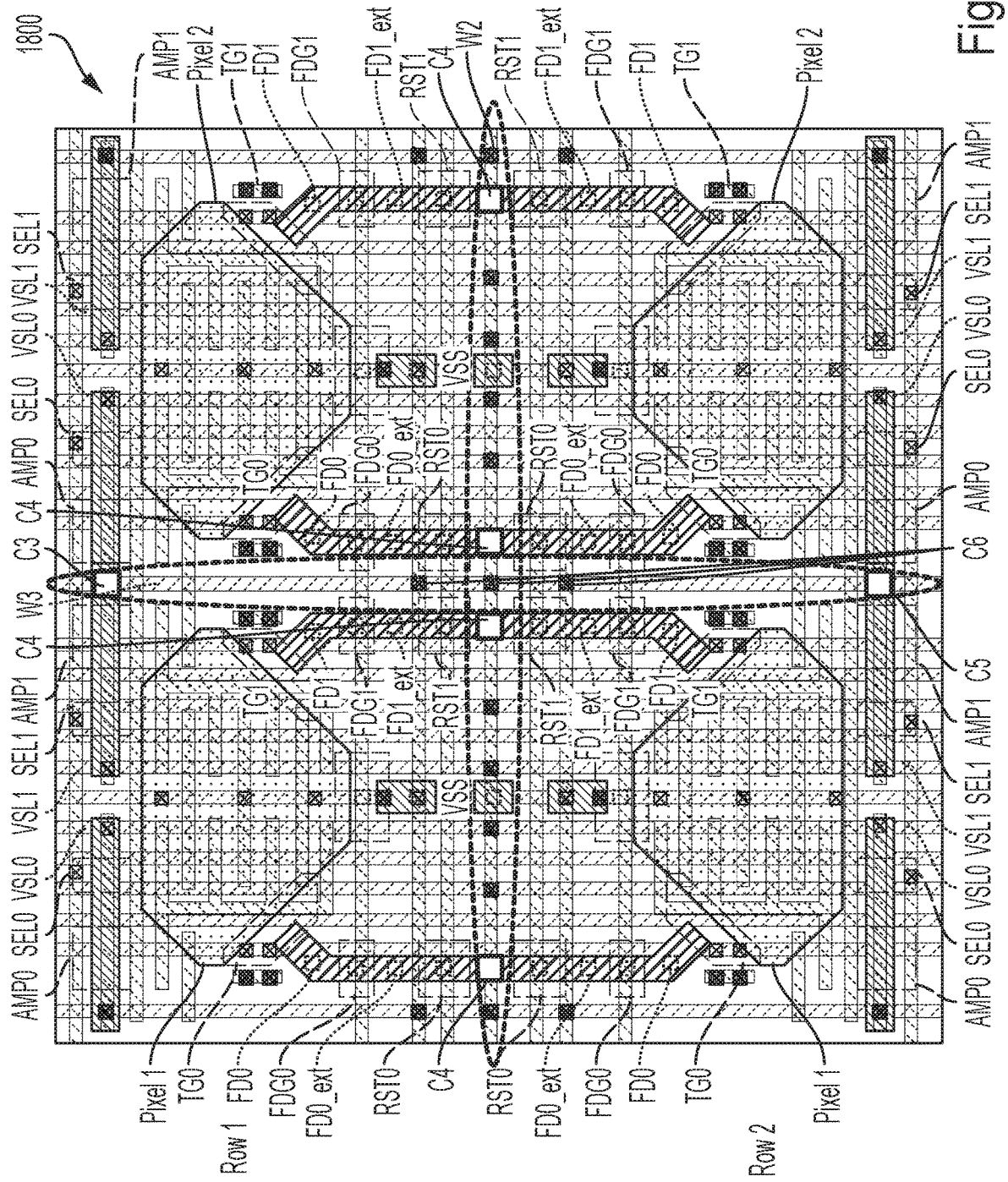
FIG. 19 illustrates the layout in FIG. 18 in more detail according to at least one example embodiment.

FIG. 17 illustrates an example schematic 1700 for two pixels 1 and 2 of an imaging device according to at least one example embodiment. FIGS. 18 and 19 illustrate an example layout 1800 for two rows of pixels having the schematic of FIG. 17, where FIG. 19 illustrates FIG. 18 in more detail with the addition of one or more wiring layers M2 and/or M3, where M2 wirings generally extend horizontally and where M3 wirings generally extend vertically.

With reference to FIGS. 17-19, it should be appreciated that a set of four pixels may share contacts to a power supply VDD both horizontally and vertically through one or more wiring layers M2 and/or M3. For example, as shown, pixels in different rows share contacts C4 to drains of reset transistors RST vertically while pixels in a same row share a contact C5 to diffusion regions of AMP transistors. The contacts C4 and contacts C5 to amplification transistors AMP may be electrically connected to one another through one or more wiring layers M2 and/or M3 in the manner shown, and receive a power supply signal VDD. In addition, all drain ports of transistors (e.g., RST, OFG, AMP) in the pixels may be connected to a common port for VDD through contacts to one or more wiring layers M2 and/or M3. For example, contacts C6 electrically connect wirings (e.g., wirings W2 and W3) in the M2 and/or M3 wiring layers that lead to drain regions of the overflow transistors OFG.

Figure 20:
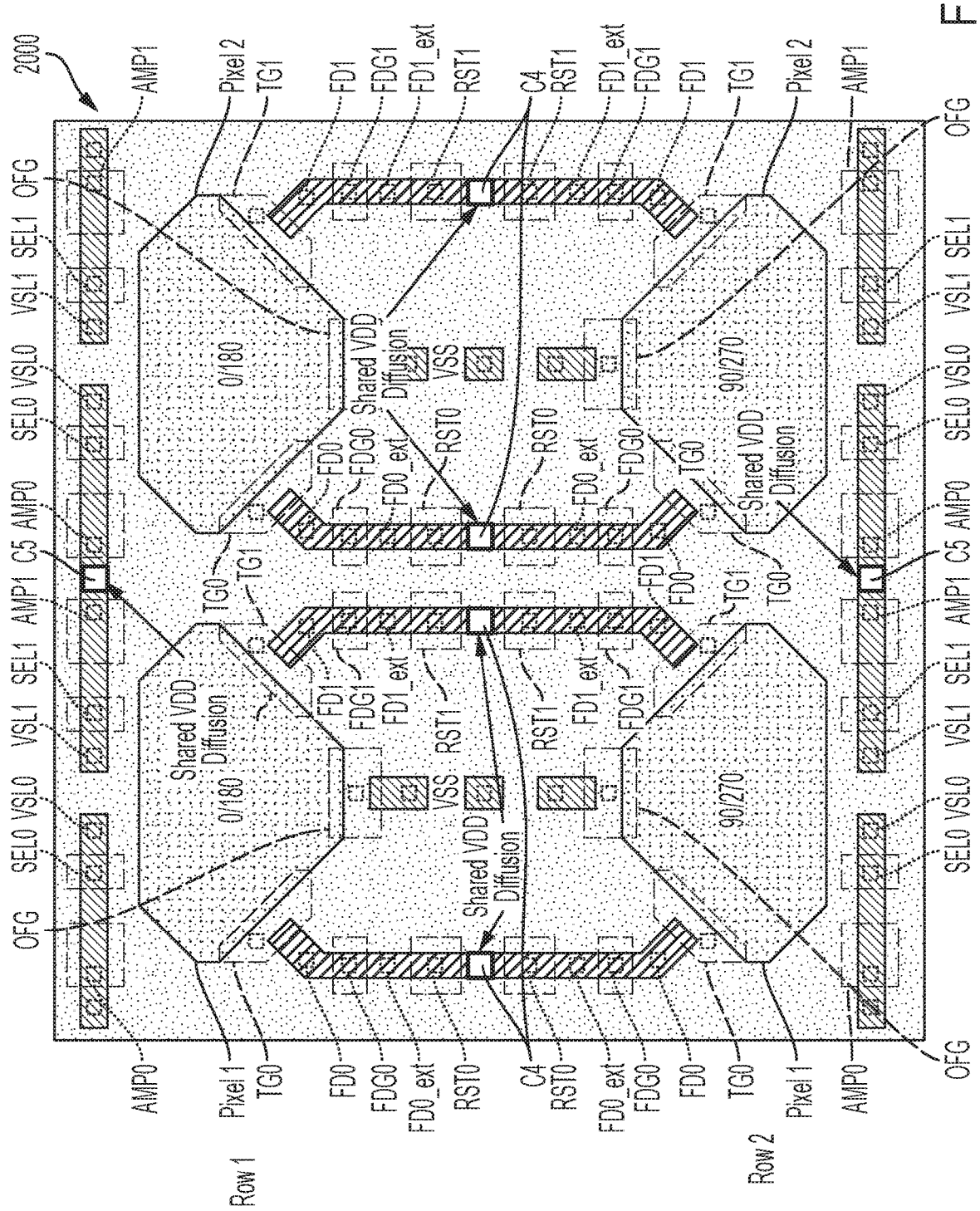
FIG. 20 illustrates an example layout for the pixel schematic in FIG. 17 for pixels in two rows according to at least one example embodiment.
Figure 21:
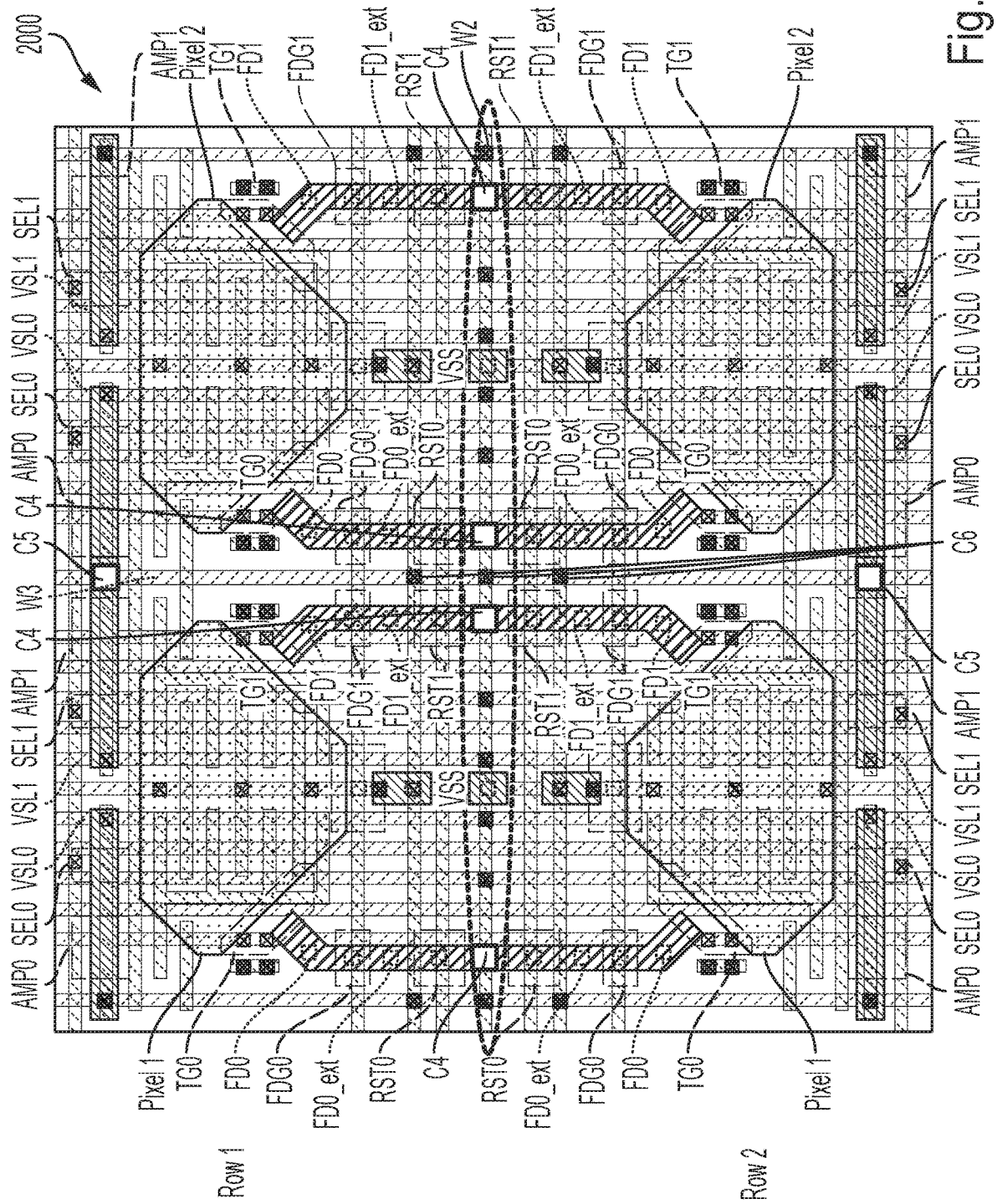
FIG. 21 illustrates the layout in FIG. 20 in more detail according to at least one example embodiment.

FIGS. 20 and 21 illustrate an example layout 2000 for two rows of pixels utilizing the schematic of FIG. 17 according to at least one example embodiment, where FIG. 21 illustrates FIG. 20 in more detail with the addition of one or more wiring layers M2 and/or M3, where M2 wirings generally extend horizontally and where M3 wirings generally extend vertically. As shown, contacts C5 to VDD for amplification transistor AMP diffusion are shared laterally between pixels having same phases. VDD contacts C4 for drain regions of reset transistors RST are shared vertically between pixels having transfer signals applied to respective TGs that have a 90 degree offset from one another. In addition, all drain ports of transistors (e.g., RST, OFG, AMP) in the pixels may be connected to a common port for VDD through contacts to one or more wiring layers M2 and/or M3.

Figure 22:
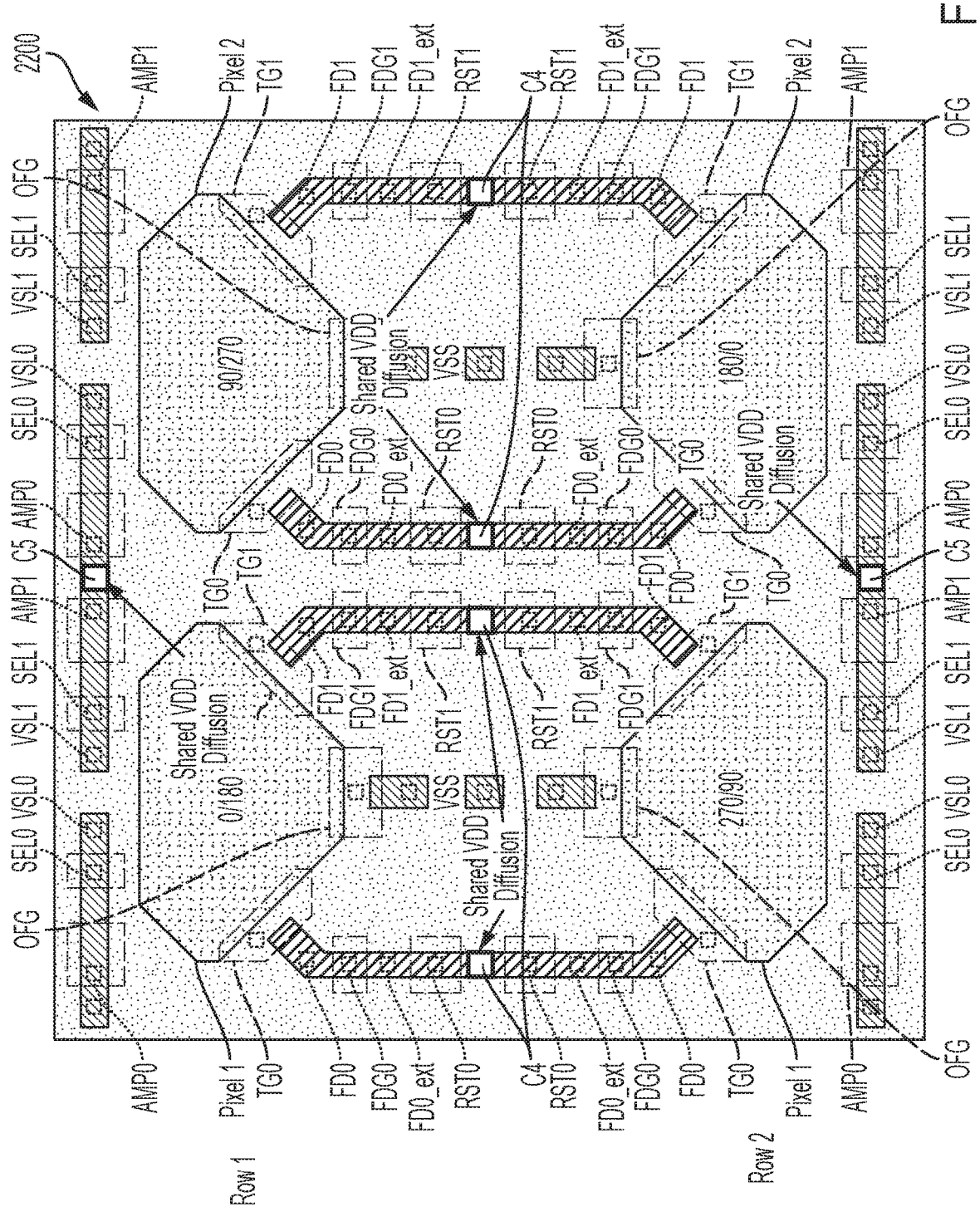
FIG. 22 illustrates an example layout for the pixel schematic in FIG. 17 for pixels in two rows according to at least one example embodiment.
Figure 23:
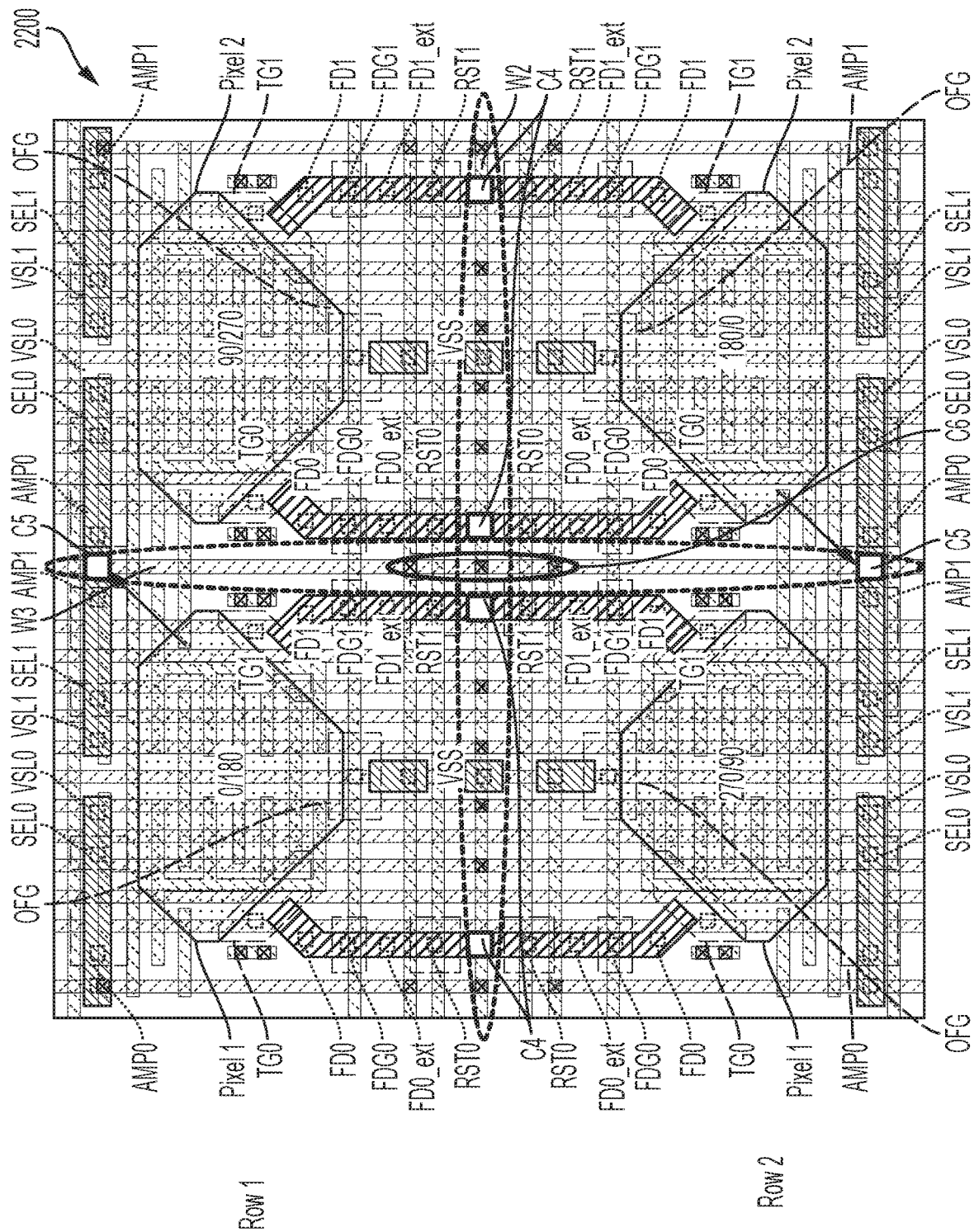
FIG. 23 illustrates the layout in FIG. 22 in more detail according to at least one example embodiment.

FIGS. 22 and 23 illustrate an example layout 2200 for two rows of pixels utilizing the schematic of FIG. 17 according to at least one example embodiment, where FIG. 23 illustrates FIG. 22 in more detail with the addition of one or more wiring layers M2 and/or M3, where M2 wirings generally extend horizontally and where M3 wirings generally extend vertically.

As shown, contacts C5 to VDD for amplification transistor AMP diffusions are shared laterally by pixels in a same row, and contacts C4 to VDD for drains of reset transistors RST are shared vertically between pixels having transfer signals applied to respective TGs that have the shown phase offsets from one another. In addition, all drain ports of transistors (e.g., RST, OFG, AMP) in the pixels may be connected to a common port for VDD through contacts to one or more wiring layers M2 and/or M3. Systems/devices that may incorporate the above described imaging devices will now be described.

Figure 24:
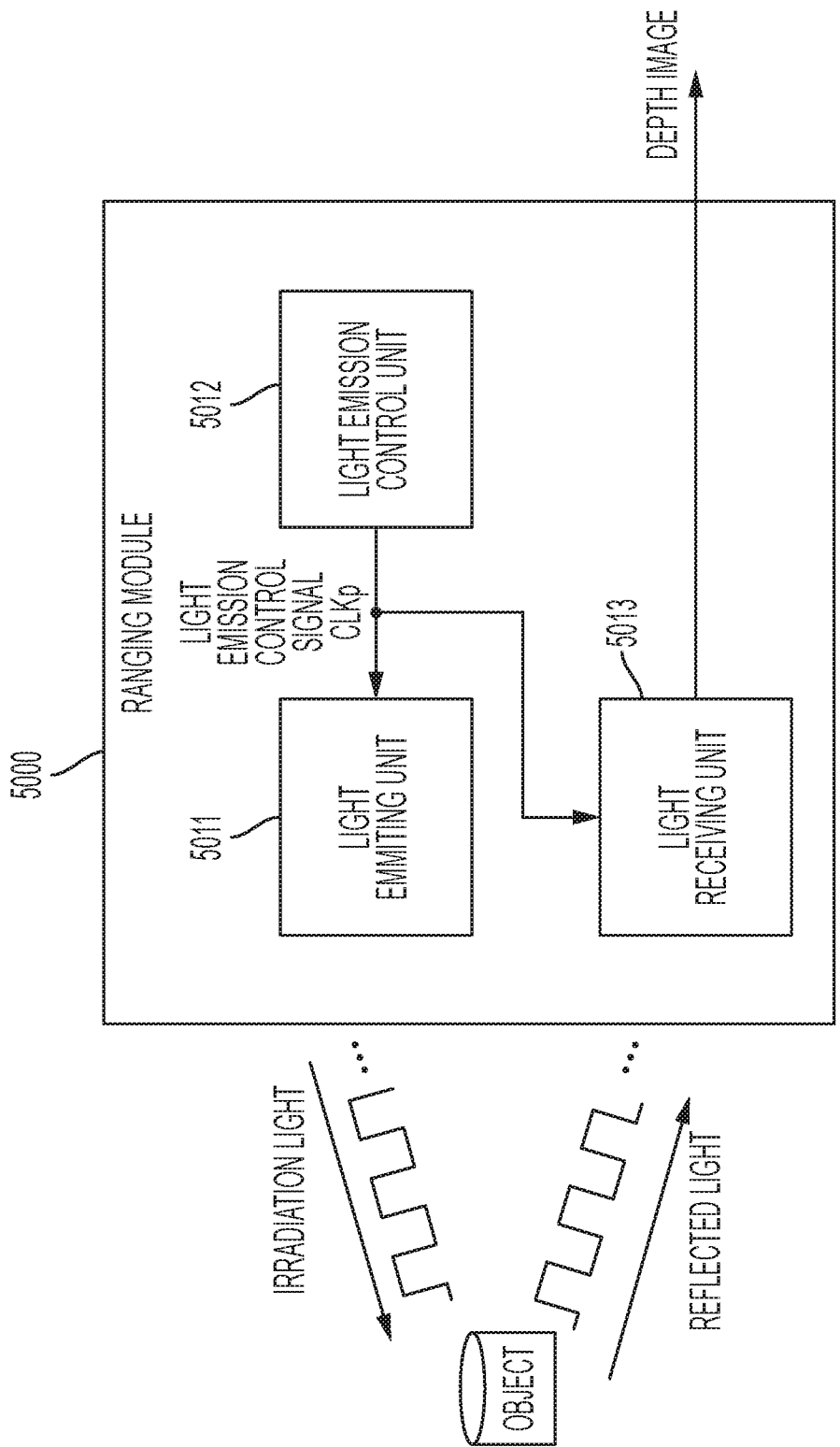
FIG. 24 is a block diagram illustrating an example of a ranging module according to at least one example embodiment.

FIG. 24 is a block diagram illustrating an example of a ranging module according to at least one example embodiment.

The ranging module 5000 includes a light emitting unit 5011, a light emission control unit 5012, and a light receiving unit 5013.

The light emitting unit 5011 has a light source that emits light having a predetermined wavelength, and irradiates the object with irradiation light of which brightness periodically changes. For example, the light emitting unit 5011 has a light emitting diode that emits infrared light having a wavelength in a range of 780 nm to 1000 nm as a light source, and generates the irradiation light in synchronization with a light emission control signal CLKp of a rectangular wave supplied from the light emission control unit 5012.

Note that, the light emission control signal CLKp is not limited to the rectangular wave as long as the control signal CLKp is a periodic signal. For example, the light emission control signal CLKp may be a sine wave.

The light emission control unit 5012 supplies the light emission control signal CLKp to the light emitting unit 5011 and the light receiving unit 5013 and controls an irradiation timing of the irradiation light. A frequency of the light emission control signal CLKp is, for example, 20 megahertz (MHz). Note that, the frequency of the light emission control signal CLKp is not limited to 20 megahertz (MHz), and may be 5 megahertz (MHz) or the like.

The light receiving unit 5013 receives reflected light reflected from the object, calculates the distance information for each pixel according to a light reception result, generates a depth image in which the distance to the object is represented by a gradation value for each pixel, and outputs the depth image.

The above-described imaging device 1 is used for the light receiving unit 5013, and for example, the imaging device 1 serving as the light receiving unit 5013 calculates the distance information for each pixel from a signal intensity detected by each tap, on the basis of the light emission control signal CLKp.

As described above, the imaging device 1 shown in FIG. 1 is able to be incorporated as the light receiving unit 5013 of the ranging module 5000 that obtains and outputs the information associated with the distance to the subject by the indirect ToF method. By adopting the imaging device 1 of one or more of the embodiments described above, it is possible to improve one or more distance measurement characteristics of the ranging module 5000 (e.g., distance accuracy, speed of measurement, and/or the like).

Figure 25:
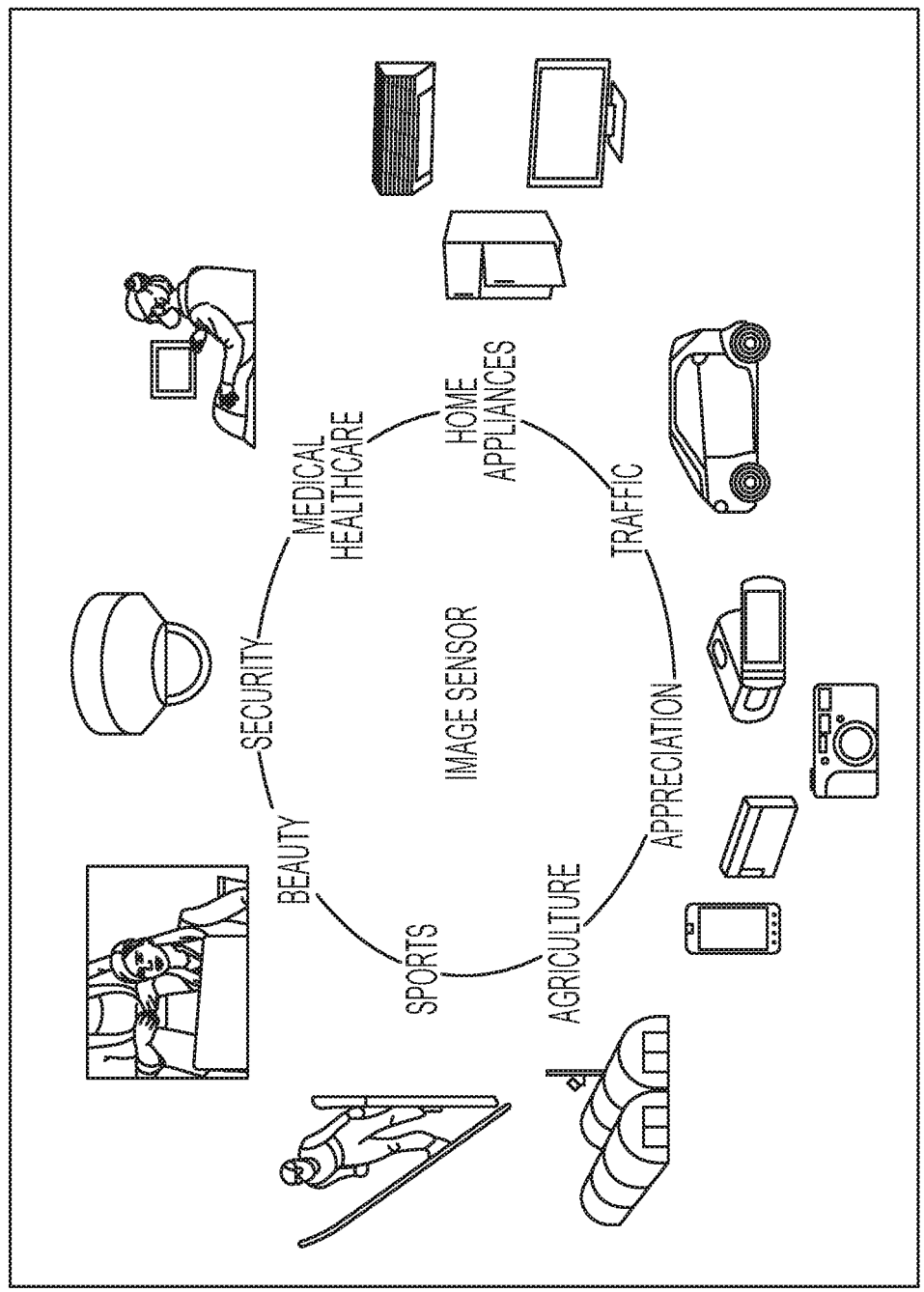
FIG. 25 is a diagram illustrating use examples of an imaging device according to at least one example embodiment.

FIG. 25 is a diagram illustrating use examples of an imaging device 1 according to at least one example embodiment.

For example, the above-described imaging device 1 (image sensor) can be used in various cases of sensing light such as visible light, infrared light, ultraviolet light, and X-rays as described below. The imaging device 1 may be included in apparatuses such as a digital still camera and a portable device with a camera function which capture images, apparatuses for traffic such as an in-vehicle sensor that captures images of a vehicle to enable automatic stopping, recognition of a driver state, measuring distance, and the like. The imaging device 1 may be included in apparatuses for home appliances such as a TV, a refrigerator, and an air-conditioner in order to photograph a gesture of a user and to perform an apparatus operation in accordance with the gesture. The imaging device 1 may be included in apparatuses for medical or health care such as an endoscope and an apparatus that performs angiography through reception of infrared light. The imaging device 1 may be included in apparatuses for security such as a security monitoring camera and a personal authentication camera. The imaging device 1 may be included in an apparatus for beauty such as a skin measuring device that photographs skin. The imaging device 1 may be included in apparatuses for sports such as an action camera, a wearable camera for sports, and the like. The imaging device 1 may be included in apparatuses for agriculture such as a camera for monitoring a state of a farm or crop.

Example embodiments will now be described with reference to FIGS. 1-25.

At least one example embodiment is directed to a first pixel 1 including a first photoelectric conversion region PD and a first amplification transistor AMP1, a second pixel 2 adjacent the first pixel 1 and including a second photoelectric conversion region PD and a second amplification transistor AMP0, and a first contact C1 coupled to the first amplification transistor AMP 1 and the second amplification transistor AMP0, and that receives a power supply signal VDD for the first amplification transistor and the second amplification transistor.

According to at least one example embodiment, the first pixel 1 and the second pixel 2 are adjacent to one another in a row direction.

According to at least one example embodiment, the imaging device 1 includes a third pixel adjacent to the second pixel 2 in the row direction and including a third amplification transistor, a second contact C2 coupled to the third amplification transistor, and a first wiring W1 that electrically connects the first contact C1 to the second contact C2 to provide the power supply signal VDD to the third amplification transistor.

According to at least one example embodiment, the first pixel 1 includes a first transfer transistor TG0 and a second transfer transistor TG1 that transfer charge from the first photoelectric conversion region PD, and the second pixel 2 includes a third transfer transistor TG0 and a fourth transfer transistor TG1 that transfer charge from the second photoelectric conversion region.

According to at least one example embodiment, the first transfer transistor TG0 receives a first transfer signal, the second transfer transistor TG1 receives a second transfer signal, the third transfer transistor TG0 receives a third transfer signal, and the fourth transfer transistor TG1 receives a fourth transfer signal. A distance to an object is calculated based on charge transferred using the first, second, third, and fourth transfer signals.

According to at least one example embodiment, the first transfer signal and the third transfer signal have a same phase difference with respect to a reference signal, and the second transfer signal and the fourth transfer signal have a same phase difference with respect to the optical signal.

According to at least one example embodiment, the first transfer signal and the third transfer signal have different phase differences with respect to a reference signal (see FIG. 6, for example), and the second transfer signal and the fourth transfer signal have different phase differences with respect to the reference signal (see FIG. 8, for example).

According to at least one example embodiment, the first amplification transistor AMP1 and the second amplification transistor AMP0 are between the first photoelectric conversion region PD and the second photoelectric conversion region PD in the row direction (see FIG. 6, for example).

According to at least one example embodiment, gates of the first amplification transistor AMP1 and the second amplification transistor AMP0 are arranged in a column direction (see FIG. 6, for example).

According to at least one example embodiment, the imaging device 1 includes a second contact C5 that receives the power supply signal VDD (e.g., bottom C5 in FIG. 13), a third pixel 1 adjacent to the first pixel 1 in the column direction and including a third amplification transistor AMP1 coupled to the second contact C5, and a third photoelectric conversion region, and a fourth pixel 2 adjacent to the second pixel 2 in the column direction and including a fourth amplification transistor AMP0 coupled to the second contact C5, and a fourth photoelectric conversion region, wherein the fourth pixel 2 is adjacent to the third pixel 1 in the row direction (see FIG. 13, for example).

According to at least one example embodiment, the imaging device 1 includes third, fourth, fifth, and sixth contacts C4. The first pixel 1 includes a first reset transistor RST0 and a second reset transistor RST1, the second pixel 1 includes a third reset transistor RST0 and a fourth reset transistor RST1, the third pixel 1 includes a fifth reset transistor RST0 and a sixth reset transistor RST1, and the fourth pixel 2 includes a seventh reset transistor RST0 and an eight reset transistor RST1. The first reset transistor and the fifth reset transistor are coupled to the third contact (leftmost C4 in FIG. 13), the second reset transistor and the sixth reset transistor are coupled to the fourth contact (left-middle C4 in FIG. 13), third reset transistor and the seventh reset transistor are coupled to the fifth contact (right-middle C4 in FIG. 13), and the fourth reset transistor and the eighth reset transistor are coupled to the sixth contact (rightmost C4 in FIG. 13).

According to at least one example embodiment, the imaging device 1 includes a first wiring W2 electrically connected to the third, fourth, fifth, and sixth contacts C4 and that receives a reset power signal RSTDRAIN for the first, second, third, fourth, fifth, sixth, seventh, and eighth reset transistors RST.

According to at least one example embodiment, the third pixel 1 includes a fifth transfer transistor and a sixth transfer transistor TG0/TG1 that transfer charge from the third photoelectric conversion region. The fourth pixel 2 includes a seventh transfer transistor and an eighth transfer transistor TG0/TG1 that transfer charge from the fourth photoelectric conversion region.

According to at least one example embodiment, the imaging device 1 includes a first wiring W2 electrically connected to the third, fourth, fifth, and sixth contacts, and a second wiring W3 electrically connected to the first wiring and the first and second contacts (see FIG. 19).

According to at least one example embodiment, the first pixel 1 includes a first overflow transistor OFG, the second pixel 2 includes a second overflow transistor OFG, the third pixel 1 includes a third overflow transistor OFG, and the fourth pixel 2 includes a fourth overflow transistor OFG.

According to at least one example embodiment, the imaging device 1 includes a third wiring OFGW that electrically connects the first overflow transistor to the second overflow transistor, and a fourth wiring OFGW that electrically connects the third overflow transistor to the fourth overflow transistor (see FIG. 12).

According to at least one example embodiment, the third wiring and the fourth wiring OFGW are electrically connected to the first wiring and the second wiring W2/W3 (see FIG. 19).

According to at least one example embodiment, the first contact C1 is electrically connected to drain regions of the first amplification transistor AMP1 and the second amplification transistor AMP0.

At least one example embodiment is directed to a system including a light source 5011, and an imaging device 1 as described herein.

At least one example embodiment is directed to an imaging device 1 including a first pixel 1 including a first photoelectric conversion region PD, a first reset transistor, and a first amplification transistor, a second pixel adjacent the first pixel and including a second photoelectric conversion region, a second reset transistor, and a second amplification transistor, a first contact C1 coupled to drain regions of the first amplification transistor and the second amplification transistor, and that receives a power supply signal VDD for the first amplification transistor and the second amplification transistor, and a second contact coupled C4 to drain regions of the first reset transistor and the second reset transistor, and that receives the power supply signal VDD for the first reset transistor and the second reset transistor.

Any processing devices, control units, processing units, etc. discussed above may correspond to one or many computer processing devices, such as a Field Programmable Gate Array (FPGA), an Application-Specific Integrated Circuit (ASIC), any other type of Integrated Circuit (IC) chip, a collection of IC chips, a microcontroller, a collection of microcontrollers, a microprocessor, Central Processing Unit (CPU), a digital signal processor (DSP) or plurality of microprocessors that are configured to execute the instructions sets stored in memory.

As will be appreciated by one skilled in the art, aspects of the present disclosure may be illustrated and described herein in any of a number of patentable classes or context including any new and useful process, machine, manufacture, or composition of matter, or any new and useful improvement thereof. Accordingly, aspects of the present disclosure may be implemented entirely hardware, entirely software (including firmware, resident software, microcode, etc.) or combining software and hardware implementation that may all generally be referred to herein as a "circuit," "module," "component," or "system." Furthermore, aspects of the present disclosure may take the form of a computer program product embodied in one or more computer readable media having computer readable program code embodied thereon.

Any combination of one or more computer readable media may be utilized. The computer readable media may be a computer readable signal medium or a computer readable storage medium. A computer readable storage medium may be, for example, but not limited to, an electronic, magnetic, optical, electromagnetic, or semiconductor system, apparatus, or device, or any suitable combination of the foregoing. More specific examples (a non-exhaustive list) of the computer readable storage medium would include the following: a portable computer diskette, a hard disk, a random access memory (RAM), a read-only memory (ROM), an erasable programmable read-only memory (EPROM or Flash memory), an appropriate optical fiber with a repeater, a portable compact disc read-only memory (CD-ROM), an optical storage device, a magnetic storage device, or any suitable combination of the foregoing. In the context of this document, a computer readable storage medium may be any tangible medium that can contain or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device. Program code embodied on a computer readable signal medium may be transmitted using any appropriate medium, including but not limited to wireless, wireline, optical fiber cable, RF, etc., or any suitable combination of the foregoing.

Computer program code for carrying out operations for aspects of the present disclosure may be written in any combination of one or more programming languages, including an object oriented programming language such as Java, Scala, Smalltalk, Eiffel, JADE, Emerald, C++, C #, VB.NET, Python or the like, conventional procedural programming languages, such as the "C" programming language, Visual Basic, Fortran 2003, Perl, COBOL 2002, PHP, ABAP, dynamic programming languages such as Python, Ruby and Groovy, or other programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider) or in a cloud computing environment or offered as a service such as a Software as a Service (SaaS).

Aspects of the present disclosure are described herein with reference to flowchart illustrations and/or block diagrams of methods, apparatuses (systems) and computer program products according to embodiments of the disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable instruction execution apparatus, create a mechanism for implementing the functions/acts specified in the flowchart and/or block diagram block or blocks.

These computer program instructions may also be stored in a computer readable medium that when executed can direct a computer, other programmable data processing apparatus, or other devices to function in a particular manner, such that the instructions when stored in the computer readable medium produce an article of manufacture including instructions which when executed, cause a computer to implement the function/act specified in the flowchart and/or block diagram block or blocks. The computer program instructions may also be loaded onto a computer, other programmable instruction execution apparatus, or other devices to cause a series of operational steps to be performed on the computer, other programmable apparatuses or other devices to produce a computer implemented process such that the instructions which execute on the computer or other programmable apparatus provide processes for implementing the functions/acts specified in the flowchart and/or block diagram block or blocks.

As used herein, the phrases "at least one," "one or more," "or," and "and/or" are open-ended expressions that are both conjunctive and disjunctive in operation. For example, each of the expressions "at least one of A, B and C," "at least one of A, B, or C," "one or more of A, B, and C," "one or more of A, B, or C," "A, B, and/or C," and "A, B, or C" means A alone, B alone, C alone, A and B together, A and C together, B and C together, or A, B and C together.

The term "a" or "an" entity refers to one or more of that entity. As such, the terms "a" (or "an"), "one or more" and "at least one" can be used interchangeably herein. It is also to be noted that the terms "comprising," "including," and "having" can be used interchangeably.

The foregoing discussion has been presented for purposes of illustration and description. The foregoing is not intended to limit the disclosure to the form or forms disclosed herein. In the foregoing Detailed Description for example, various features of the disclosure are grouped together in one or more aspects, embodiments, and/or configurations for the purpose of streamlining the disclosure. The features of the aspects, embodiments, and/or configurations of the disclosure may be combined in alternate aspects, embodiments, and/or configurations other than those discussed above. This method of disclosure is not to be interpreted as reflecting an intention that the claims require more features than are expressly recited in each claim. Rather, as the following claims reflect, inventive aspects lie in less than all features of a single foregoing disclosed aspect, embodiment, and/or configuration. Thus, the following claims are hereby incorporated into this Detailed Description, with each claim standing on its own as an embodiment of the disclosure.

Moreover, though the description has included description of one or more aspects, embodiments, and/or configurations and certain variations and modifications, other variations, combinations, and modifications are within the scope of the disclosure, e.g., as may be within the skill and knowledge of those in the art, after understanding the present disclosure. It is intended to obtain rights which include alternative aspects, embodiments, and/or configurations to the extent permitted, including alternate, interchangeable and/or equivalent structures, functions, ranges or steps to those claimed, whether or not such alternate, interchangeable and/or equivalent structures, functions, ranges or steps are disclosed herein, and without intending to publicly dedicate any patentable subject matter.

Example embodiments may be configured according to the following:

(1) An imaging device, comprising:
    a first pixel including a first photoelectric conversion region and a first amplification transistor;
    a second pixel adjacent the first pixel and including a second photoelectric conversion region and a second amplification transistor; and
    a first contact coupled to the first amplification transistor and the second amplification transistor, and that receives a power supply signal for the first amplification transistor and the second amplification transistor.

(2) The imaging device of (1), wherein the first pixel and the second pixel are adjacent to one another in a row direction.

(3) The imaging device of one or more of (1) to (2), further comprising:
    a third pixel adjacent to the second pixel in the row direction and including a third amplification transistor;
    a second contact coupled to the third amplification transistor; and
    a first wiring that electrically connects the first contact to the second contact to provide the power supply signal to the third amplification transistor.

(4) The imaging device of one or more of (1) to (3), wherein the first pixel includes a first transfer transistor and a second transfer transistor that transfer charge from the first photoelectric conversion region, and wherein the second pixel includes a third transfer transistor and a fourth transfer transistor that transfer charge from the second photoelectric conversion region.

(5) The imaging device of one or more of (1) to (4), wherein the first transfer transistor receives a first transfer signal, the second transfer transistor receives a second transfer signal, the third transfer transistor receives a third transfer signal, and the fourth transfer transistor receives a fourth transfer signal, and wherein a distance to an object is calculated based on charge transferred using the first, second, third, and fourth transfer signals.

(6) The imaging device of one or more of (1) to (5), wherein the first transfer signal and the third transfer signal have a same phase difference with respect to a reference signal, and wherein the second transfer signal and the fourth transfer signal have a same phase difference with respect to the optical signal.

(7) The imaging device of one or more of (1) to (6), wherein the first transfer signal and the third transfer signal have different phase differences with respect to a reference signal, and wherein the second transfer signal and the fourth transfer signal have different phase differences with respect to the reference signal.

(8) The imaging device of one or more of (1) to (7), wherein the first amplification transistor and the second amplification transistor are between the first photoelectric conversion region and the second photoelectric conversion region in the row direction.

(9) The imaging device of one or more of (1) to (8), wherein gates of the first amplification transistor and the second amplification transistor are arranged in a column direction.

(10) The imaging device of one or more of (1) to (9), further comprising:
a second contact that receives the power supply signal;
a third pixel adjacent to the first pixel in the column direction and including a third amplification transistor coupled to the second contact, and a third photoelectric conversion region; and
a fourth pixel adjacent to the second pixel in the column direction and including a fourth amplification transistor coupled to the second contact, and a fourth photoelectric conversion region, wherein the fourth pixel is adjacent to the third pixel in the row direction.

(11) The imaging device of one or more of (1) to (10), further comprising:
third, fourth, fifth, and sixth contacts,
wherein the first pixel includes a first reset transistor and a second reset transistor, the second pixel includes a third reset transistor and a fourth reset transistor, the third pixel includes a fifth reset transistor and a sixth reset transistor, and the fourth pixel includes a seventh reset transistor and an eight reset transistor, and wherein the first reset transistor and the fifth reset transistor are coupled to the third contact, wherein the second reset transistor and the sixth reset transistor are coupled to the fourth contact, wherein third reset transistor and the seventh reset transistor are coupled to the fifth contact, and wherein the fourth reset transistor and the eighth reset transistor are coupled to the sixth contact.

(12) The imaging device of one or more of (1) to (11), further comprising:
a first wiring electrically connected to the third, fourth, fifth, and sixth contacts and that receives a reset power signal for the first, second, third, fourth, fifth, sixth, seventh, and eighth reset transistors.

(13) The imaging device of one or more of (1) to (12), wherein the third pixel includes a fifth transfer transistor and a sixth transfer transistor that transfer charge from the third photoelectric conversion region, and wherein the fourth pixel includes a seventh transfer transistor and an eighth transfer transistor that transfer charge from the fourth photoelectric conversion region.

(14) The imaging device of one or more of (1) to (13), further comprising:
a first wiring electrically connected to the third, fourth, fifth, and sixth contacts; and
a second wiring electrically connected to the first wiring and the first and second contacts.

(15) The imaging device of one or more of (1) to (14), wherein the first pixel includes a first overflow transistor, the second pixel includes a second overflow transistor, the third pixel includes a third overflow transistor, and the fourth pixel includes a fourth overflow transistor.

(16) The imaging device of one or more of (1) to (15), further comprising:
a third wiring that electrically connects the first overflow transistor to the second overflow transistor; and
a fourth wiring that electrically connects the third overflow transistor to the fourth overflow transistor.

(17) The imaging device of one or more of (1) to (16), wherein the third wiring and the fourth wiring are electrically connected to the first wiring and the second wiring.

(18) The imaging device of one or more of (1) to (17), wherein the first contact is electrically connected to drain regions of the first amplification transistor and the second amplification transistor.

(19) A system, comprising:
a light source; and
an imaging device, comprising:
a first pixel including a first photoelectric conversion region and a first amplification transistor;
a second pixel adjacent the first pixel and including a second photoelectric conversion region and a second amplification transistor; and
a first contact coupled to the first amplification transistor and the second amplification transistor, and that receives a power supply signal for the first amplification transistor and the second amplification transistor.

(20) An imaging device, comprising:
a first pixel including a first photoelectric conversion region, a first reset transistor, and a first amplification transistor;
a second pixel adjacent the first pixel and including a second photoelectric conversion region, a second reset transistor, and a second amplification transistor; and
a first contact coupled to drain regions of the first amplification transistor and the second amplification transistor, and that receives a power supply signal for the first amplification transistor and the second amplification transistor;
a second contact coupled to drain regions of the first reset transistor and the second reset transistor, and that receives the power supply signal for the first reset transistor and the second reset transistor.

Any one or more of the aspects/embodiments as substantially disclosed herein.

Any one or more of the aspects/embodiments as substantially disclosed herein optionally in combination with any one or more other aspects/embodiments as substantially disclosed herein.

One or more means adapted to perform any one or more of the above aspects/embodiments as substantially disclosed herein.

It is claimed:

1. An imaging device, comprising:
a first pixel including a first photoelectric conversion region and a first amplification transistor;
a second pixel adjacent the first pixel and including a second photoelectric conversion region and a second amplification transistor; and
a first contact coupled to the first amplification transistor and the second amplification transistor, and that receives a power supply signal for the first amplification transistor and the second amplification transistor,
wherein the first pixel and the second pixel are adjacent to one another in a row direction,
wherein the first pixel includes a first transfer transistor and a second transfer transistor that transfer charge from the first photoelectric conversion region, and
wherein the second pixel includes a third transfer transistor and a fourth transfer transistor that transfer charge from the second photoelectric conversion region.

2. The imaging device of claim 1, further comprising:
a third pixel adjacent to the second pixel in the row direction and including a third amplification transistor;
a second contact coupled to the third amplification transistor; and
a first wiring that electrically connects the first contact to the second contact to provide the power supply signal to the third amplification transistor.

3. The imaging device of claim 1, wherein the first transfer transistor receives a first transfer signal, the second transfer transistor receives a second transfer signal, the third transfer transistor receives a third transfer signal, and the fourth transfer transistor receives a fourth transfer signal, and wherein a distance to an object is calculated based on charge transferred using the first, second, third, and fourth transfer signals.

4. The imaging device of claim 3, wherein the first transfer signal and the third transfer signal have a same phase difference with respect to a reference signal, and wherein the second transfer signal and the fourth transfer signal have a same phase difference with respect to the reference signal.

5. The imaging device of claim 3, wherein the first transfer signal and the third transfer signal have different phase differences with respect to a reference signal, and wherein the second transfer signal and the fourth transfer signal have different phase differences with respect to the reference signal.

6. The imaging device of claim 1, wherein the first amplification transistor and the second amplification transistor are between the first photoelectric conversion region and the second photoelectric conversion region in the row direction.

7. The imaging device of claim 6, wherein gates of the first amplification transistor and the second amplification transistor are arranged in a column direction.

8. The imaging device of claim 1, further comprising:
a second contact that receives the power supply signal;
a third pixel adjacent to the first pixel in a column direction and including a third amplification transistor coupled to the second contact, and a third photoelectric conversion region; and
a fourth pixel adjacent to the second pixel in the column direction and including a fourth amplification transistor coupled to the second contact, and a fourth photoelectric conversion region, wherein the fourth pixel is adjacent to the third pixel in the row direction.

9. The imaging device of claim 8, further comprising:
third, fourth, fifth, and sixth contacts,
wherein the first pixel includes a first reset transistor and a second reset transistor, the second pixel includes a third reset transistor and a fourth reset transistor, the third pixel includes a fifth reset transistor and a sixth reset transistor, and the fourth pixel includes a seventh reset transistor and an eighth reset transistor, wherein the first reset transistor and the fifth reset transistor are coupled to the third contact, wherein the second reset transistor and the sixth reset transistor are coupled to the fourth contact, wherein third reset transistor and the seventh reset transistor are coupled to the fifth contact, and wherein the fourth reset transistor and the eighth reset transistor are coupled to the sixth contact.

10. The imaging device of claim 9, further comprising:
a first wiring electrically connected to the third, fourth, fifth, and sixth contacts and that receives a reset power signal for the first, second, third, fourth, fifth, sixth, seventh, and eighth reset transistors.

11. The imaging device of claim 10, wherein the third pixel includes a fifth transfer transistor and a sixth transfer transistor that transfer charge from the third photoelectric conversion region, and wherein the fourth pixel includes a seventh transfer transistor and an eighth transfer transistor that transfer charge from the fourth photoelectric conversion region.

12. The imaging device of claim 9, further comprising:
a first wiring electrically connected to the third, fourth, fifth, and sixth contacts; and
a second wiring electrically connected to the first wiring and the first and second contacts.

13. The imaging device of claim 12, wherein the first pixel includes a first overflow transistor, the second pixel includes a second overflow transistor, the third pixel includes a third overflow transistor, and the fourth pixel includes a fourth overflow transistor.

14. The imaging device of claim 13, further comprising:
a third wiring that electrically connects the first overflow transistor to the second overflow transistor; and
a fourth wiring that electrically connects the third overflow transistor to the fourth overflow transistor.

15. The imaging device of claim 14, wherein the third wiring and the fourth wiring are electrically connected to the first wiring and the second wiring.

16. The imaging device of claim 1, wherein the first contact is electrically connected to drain regions of the first amplification transistor and the second amplification transistor.

17. A system, comprising:
a light source; and
an imaging device, comprising:
a first pixel including a first photoelectric conversion region and a first amplification transistor;
a second pixel adjacent the first pixel and including a second photoelectric conversion region and a second amplification transistor; and a first contact coupled to the first amplification transistor and the second amplification transistor, and that receives a power supply signal for the first amplification transistor and the second amplification transistor, wherein the first pixel and the second pixel are adjacent to one another in a row direction, wherein the first amplification transistor and the second amplification transistor are between the first photoelectric conversion region and the second photoelectric conversion region in the row direction, and wherein gates of the first amplification transistor and the second amplification transistor are arranged in a column direction.

18. An imaging device, comprising:

a first pixel including a first photoelectric conversion region, a first reset transistor, and a first amplification transistor;

a second pixel adjacent the first pixel in a row direction and including a second photoelectric conversion region, a second reset transistor, and a second amplification transistor; and a first contact coupled to drain regions of the first amplification transistor and the second amplification transistor, and that receives a power supply signal for the first amplification transistor and the second amplification transistor, wherein, in a plan view, the first contact is a single contact located between a gate of the first amplification transistor and a gate of the second amplification transistor, and wherein, in the plan view, the gate of the first amplification transistor, the first contact, and the gate of the second amplification transistor are arranged in a column direction.

* * * * *